United States Patent
Otsuki et al.

(10) Patent No.: US 6,559,023 B2
(45) Date of Patent: May 6, 2003

(54) METHOD OF FABRICATING A SEMICONDUCTOR DEVICE WITH PHOSPHOROUS AND BORON ION IMPLANTATION, AND BY ANNEALING TO CONTROL IMPURITY CONCENTRATION THEREOF

(75) Inventors: Masahito Otsuki, Nagano (JP); Seiji Momota, Nagano (JP); Mitsuaki Kirisawa, Nagano (JP); Takashi Yoshimura, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 10/073,528

(22) Filed: Feb. 11, 2002

(65) Prior Publication Data

US 2002/0127783 A1 Sep. 12, 2002

(30) Foreign Application Priority Data

Feb. 9, 2001 (JP) ........................... 2001-034544

(51) Int. Cl.⁷ ........................................ H01L 21/8238
(52) U.S. Cl. ..................... 438/342; 438/138
(58) Field of Search ................. 438/138, 235, 438/342, 350, 530

(56) References Cited

U.S. PATENT DOCUMENTS 6,001,678 A * 12/1999 Takahashi ............... 438/238
6,221,721 B1 * 4/2001 Takahashi ............... 438/270
6,309,920 B1 * 10/2001 Laska et al. ............. 438/202

FOREIGN PATENT DOCUMENTS

JP 3-96281 4/1991

* cited by examiner

Primary Examiner—Richard Elms
Assistant Examiner—Beth E. Owens
(74) Attorney, Agent, or Firm—Rossi & Associates

(57) ABSTRACT

A method for manufacturing a semiconductor device constituting an JGHT is provided that allows to manufacture the device using an inexpensive wafer and with high yields, and achieves low losses. Specifically, after an emitter electrode is formed, a reverse principal surface is polished to a specified thickness. The center line average height Ra of the polished surface is controlled to be not more than 1 μm, and the filtered center line waviness Wca is kept within 10 μm. The polished surface is selectively cleaned with an aqueous chemical solution to remove particles. To the cleaned surface, phosphorus ions arc implanted for forming a field-stop layer and boron ions are implanted for forming a collector layer. The wafer is then put into a diffusion furnace and annealed at a temperature from 300° C. to 550° C. to form a field-stop layer and a collector layer. Finally, a collector electrode is formed.

18 Claims, 28 Drawing Sheets

US 6,559,023 B2

METHOD OF FABRICATING A SEMICONDUCTOR DEVICE WITH PHOSPHOROUS AND BORON ION IMPLANTATION, AND BY ANNEALING TO CONTROL IMPURITY CONCENTRATION THEREOF

FIELD OF THE INVENTION

The present invention relates to a method for manufacturing a semiconductor device and in particular, to a method for manufacturing a semiconductor device that constitutes an insulated gate bipolar transistor.

BACKGROUND

Insulated gate bipolar transistors (hereinafter referred to as IGBTs), specifically the devices of planar gate structures as shown in FIG. 30 and FIG. 31 and the devices of trench gate structures as shown in FIG. 32 and FIG. 33, are known. A non-punch-through type IGBT as shown in FIG. 30 or FIG. 32 comprises a base layer 2 that is composed of an n-type semiconductor substrate made of for example an FZ wafer; a p-type channel diffusion region 3, an n-type emitter diffusion region 4, an emitter electrode 5, a gate-insulating film 6, a gate electrode 7, and an insulator film 8, which are formed on one surface of the substrate; and a p-type collector layer 9 and a collector electrode 10, which are formed on the reverse surface side of the substrate.

A punch-through type IGBT as shown in FIG. 31 and FIG. 33 employs a wafer, that is an epitaxial wafer, and comprises a p-type wafer Ii, an n-type semiconductor layer 12, and another n-type semiconductor layer 13 having the impurity concentration lower than that of the n-type semiconductor layer 12, the both n-type semiconductor layers being epil-axially grown on the p-type wafer ii. The body of the p-type wafer 11 constitutes a collector layer; the n-type semiconductor layer 12 on the collector layer constitutes a buffer layer; and the n-type semiconductor layer 13 on the buffer layer constitutes a base layer 2. In the surface region on the side of the base layer 2 of the epitaxial wafer, formed are a p-type channel diffusion region 3, an n-type emitter diffusion region 4, an emitter electrode 5, a gate-insulating film 6. a gate electrode 7, and an insulator film 8. A collector electrode 10 is formed on the surface of the side of the collector layer 11, which is the reverse side of the epitaxial wafer.

However, the non-punch-through type IGBT mentioned above has a disadvantage of large losses because of the thick base layer 2, which is required so that the depletion layer in the turn-off operation does not extend beyond the thickness of the base layer 2. In the punch-through type IGBT that is also mentioned above, the thickness of the base layer 2 is about 120 µm for an example of a blocking voltage class of 1,200 V. The thickness value is smaller than the thickness of about 180 µm of the base layer of a non-punch-through type IGBT, which results in a lower losses of the punch-through type IGBT. However, the punch-through type IGBT has a disadvantage of its higher cost of the chip caused by the lower yield of the chip and the higher cost (over twice) of the epitaxial wafer than the FZ wafer.

In view of the foregoing, it would be desirable to provide a method for manufacturing a semiconductor device constituting an IGBT that can be produced with a high yield using an inexpensive wafer and generates little loss.

SUMMARY OF THE INVENTION

The present invention is directed to a method for manufacturing a semiconductor device, the method using a wafer, for example an FZ wafer that is cut from an ingot and polished and cleaned on its surface, the bulk part of the wafer composing a base layer. The method comprises steps of forming a p-type channel diffusion layer, an n-type emitter diffusion layer, an emitter electrode, a gate-insulating film, and a gate electrode in one principal surface region of the wafer. After that, the method further comprises steps of implanting phosphorus ions into a shallow portion of a reverse surface region of the wafer, and subsequently implanting boron ions into a shallower portion of the wafer. Then, the wafer is annealed to form an n-type impurity diffusion layer (hereinafter referred to as a field-stop layer) for stopping an electric field during turn-off and a collector layer, on which a collector electrode is formed.

The thickness of this field-stop layer defined by Xfs–Xj is from 0.5 µm to 3 µm, where Xfs is the position at which the impurity concentration in the field-stop layer becomes twice the impurity concentration of the base layer, and Xj is the position of the junction between the field-stop layer and the collector layer.

One reason why the thickness of the field-stop layer, Xfs–Xj, is in the above indicated range is that when forming the field-stop layer by means of ion implantation, the maximum depth is 3 µm due to the energy limit of the ion implantation available at present. On the other hand, the reason for the lower limit is that a diffusion layer thinner than the above-indicated lower limit is difficult to be formed by ion implantation with precise control.

Advantageously, a contact layer may be formed by implanting boron ions or $BF_2^+$ ions before forming the collector electrode. The contact layer allows the collector electrode to contact electrically with the collector layer with low resistance.

Advantageously, the boron ions are implanted holding the semiconductor substrate at a temperature lower than the room temperature, for example at 80 K. When the boron ions are implanted at such a low temperature, the activation rate in an annealing operation is higher than the implantation at a temperature not lower than the room temperature, and the activation rate of 15% to 60% can be attained for annealing temperatures between 400° C. to 550° C. This is effective for increasing boron concentration in the collector layer without increasing the amount of ions implanted in the collector layer and without elevating the annealing temperature.

Annealing temperature after the ion implantation is appropriately in the range from 300° C. to 550° C. in the case where the annealing is executed in a diffusion furnace, and in the range from 300° C. to 600° C. in the case where the annealing is conducted by means of rapid thermal annealing. One reason for the upper limit is to prevent the emitter electrode from melting and the contact resistance from raising. Another reason is to suppress the activation rate of phosphorus below 15% so that the boron concentration is kept higher than the phosphorus concentration, while the lower limit is the lowest temperature for activating the implanted phosphorus ions.

When the annealing after the ion implantation is performed by laser annealing, the wavelength of the laser light is preferably in the range from 150 nm to 1,060 nm, and the irradiation energy density is appropriately from 0.5 J/cm² to 3 J/cm². The reason for the upper limit of 3 J/cm² of irradiated energy density is to suppress surface roughness, center line average height, to not more than 1 µm so as to restrain leakage current minimum. The lower limit of the irradiation energy density is determined because irradiation with the lower energy density hardly activates the implanted ions.

The annealing after ion implantation may be any combination of two or three of the above-mentioned annealing methods: diffusion furnace annealing, rapid thermal annealing, and laser annealing. This is because the combined annealing brings about higher activation rate of the boron ions.

The center line average height Ra of the ion implanted surface is preferably not larger than 1 μm. When the Ra is within this limit, leakage current Ir can be less than 1 mA which is the acceptable limit. However, when the Ra exceeds 1 μm, the leakage current rises to 1 mA or more and thermal runaway becomes liable to occur. The centerline average height is specified in article B0601 of Japanese Industrial Standards.

The filtered center line waviness Wca of the surface implanted with the impurity ions is preferably not larger than 10 μm. When the filtered center line waviness Wca is within this limit, drop of the blocking voltage is insignificant. However, the Wca exceeds 10 μm, the blocking voltage falls sharply. The filtered center line waviness is specified in article B0610 of Japanese Industrial Standards.

The surface, to which ion implantation is to be conducted, is preferably selectively cleaned using an aqueous chemical solution such as an ammonia-hydrogen peroxide mixture. Such a cleaning operation remarkably effectively eliminates particles that may cause lowering of rate of non-defective units. Alternatively, the selective cleaning of the surface may be performed by using functional water consisting of hydrogenated ultrapure water and ozonized ultrapure water, simultaneously employing megasonic frequencies. Such a cleaning operation effectively eliminates particles. Further, the selective cleaning of the surface may be performed combining a cleaning operation using chemicals-dissolved water and a cleaning operation using functional water consisting of hydrogenated ultrapure water and ozonized ultrapure water simultaneously employing megasonic frequencies.

Advantageously, the collector electrode is formed by depositing a plurality of metals, and aluminum or platinum is first deposited. Aluminum and platinum exhibits barrier height to p-type semiconductor substances, which compose the collector layer and the contact layer, lower than the barrier height of titanium, and bring about low on-state voltage. The aluminum and the platinum in that part have preferably a thickness not smaller than 0.3 μm in order to maintain low on-state voltage.

In an IGBT according to the invention, the field-stop layer that is an impurity diffusion layer is formed in a principal surface region of a semiconductor substrate with the depth not larger than 3 μm that is the maximum depth practically feasible within the energy limit of ion implantation. That is, this impurity diffusion layer may be formed by means of ion implantation. Therefore, the IGBT of the invention can be produced employing an inexpensive wafer such as an FZ wafer like in a non-punch-through type IGBT with high yields.

BRIEF DESCRIPTION OF THE DRAWINGS

The invention will be described with reference to certain preferred embodiments thereof along with the accompanying drawings, wherein.

DETAILED DESCRIPTION OF THE PREFERRED EMBODIMENTS

Figure 1:
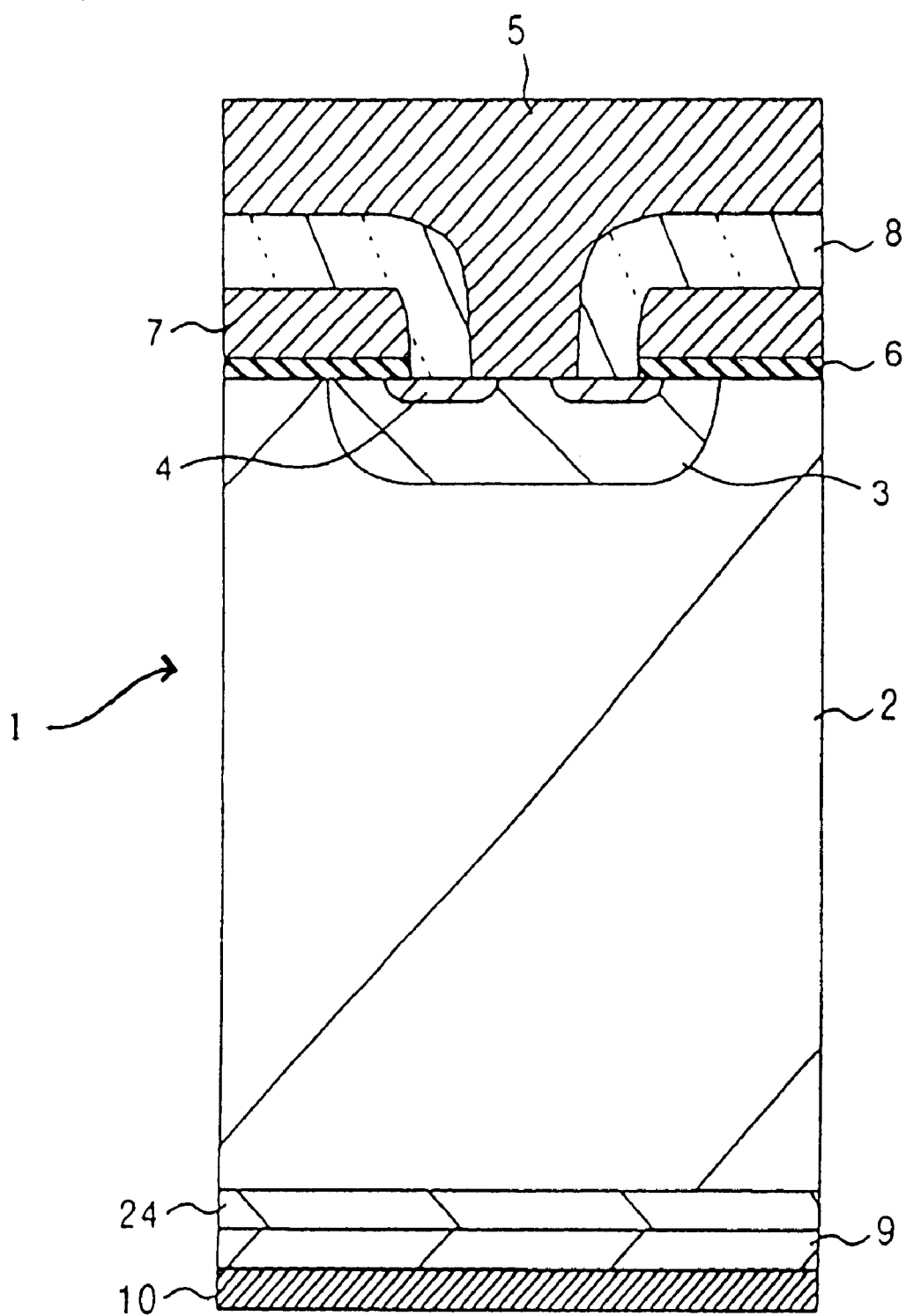
FIG. 1 is a cross-sectional view of an example of a semiconductor device manufactured by a manufacturing method according to the present invention.

FIG. 1 is a cross-sectional view of an example of a semiconductor device 1 manufactured by a method according to the present invention. The illustrated semiconductor device is an IGBT with a planar gate structure including a base layer 2 that is composed, for example, of an n-type semiconductor substrate made of a silicon FZ wafer, On the surface region of the base layer 2, a p-type channel diffusion region 3 is formed. In this channel diffusion region 3, an n-type emitter diffusion region 4 is formed.

On a part of this emitter diffusion region 4, a gate electrode 7 is formed through a gate-insulating film 6. An emitter electrode 5 is electrically connected to the channel diffusion layer 3 and the emitter diffusion region 4, and insulated from the gate electrode 7 through an insulator film 8. In a shallow portion of the reverse surface region of the base layer 2, a field-stop layer 24 composed of an n-type impurity diffusion layer is formed. A p-type collector layer 9 is formed in the portion of the reverse surface region shallower than the field-stop layer 24. A collector electrode 10 is formed on the collector layer 9.

Figure 2:
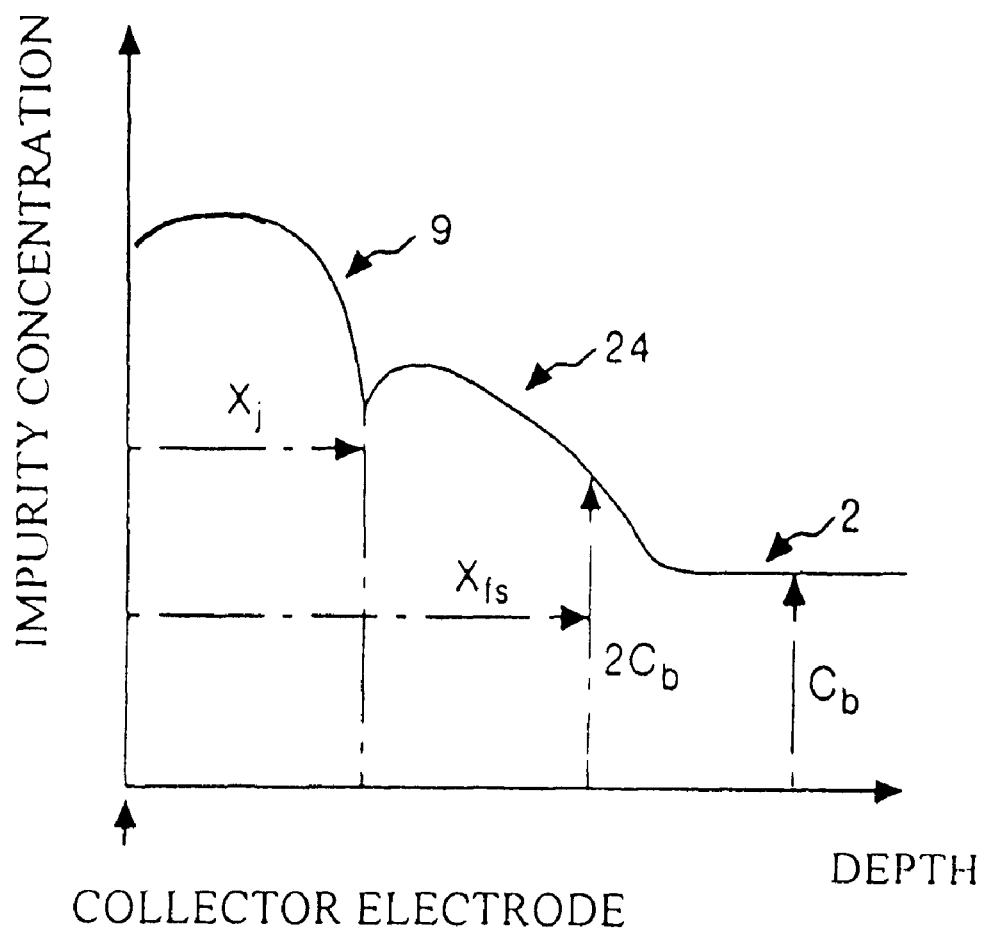
FIG. 2 is a chart showing impurity profile near a collector layer of an IGBT having the structure shown in FIG. 1.

FIG. 2 shows an impurity profile near the collector layer 9 of the IGBT having the structure illustrated in FIG. 1. FIG. 2 illustrates the impurity concentration in the base layer 2, the peak impurity concentration in the collector layer 9, and the peak impurity concentration in the field-stop layer 24, respectively. Xj and Xfs are the depth at which the impurity concentration takes each maximum value in the collector layer 9 and the field-stop layer 24, respectively. Xfs represents the depth at which the impurity concentration in the field-stop layer 24 equals twice (2Cb) the impurity concentration Cb of the base layer 2. These depths are the distances from the boundary between the collector layer 9 and the collector electrode 10. Although not shown in FIG. 1, a contact layer may be formed between the collection layer 9 and the collector electrode 10. The contact layer has an impurity concentration higher than the collector layer and contacts with the collector electrode with low resistance.

Xfs−Xj may be taken as a thickness of the field-stop layer 24 in the IGBT shown in FIG. 1. The value of this thickness ranges from 0.5 $\mu$m to 3 $\mu$m. While the field-stop layer 24 is formed by means of ion implantation in this embodiment, the maximum depth of the ion implantation is 3 $\mu$m because of the limitation of the practically available ion implantation energy. Therefore, ions cannot be implanted into a deeper region than the above-indicated upper limit.

On the other hand, the lower limit is based on the fact that a diffusion layer thinner than the above-indicated lower limit is practically infeasible to be formed by ion implantation with precise control. Nevertheless, if ion implantation equipment would be so improved that the ions could be implanted more deeply than the above-mentioned upper limit or the diffusion layer could be formed more shallowly than the above-mentioned lower limit with precise control, the range of the thickness of the field-stop layer may be extended beyond the above limitations corresponding to the technology development.

Resistivity of the semiconductor substrate or resistivity of the FZ wafer is uniform in the thickness direction and has a value of 60 $\Omega$cm, for example. Here, "uniform" in the thickness direction means that variation of the resistivity is within ±20% in the thickness direction of the wafer. The wafer used in the invention may not be an FZ wafer so long as the variation of resistivity in the thickness direction of the wafer is within ±20%. If the resistivity of the wafer is 60 $\Omega$cm, the resistivity of the base layer 2 is 60 $\Omega$cm. Thickness of the base layer 2 is about 120 $\mu$m for an IGBT of blocking voltage of 1,200 V. Because the field-stop layer 24 stops the depletion layer that emerges in the base layer 2 during turn-off just like a buffer layer of a conventional punch-through type IGBT, the thickness of the base layer only needs to be nearly equal to the thickness of the base layer of the conventional punch-through type IGBT.

Figure 3:
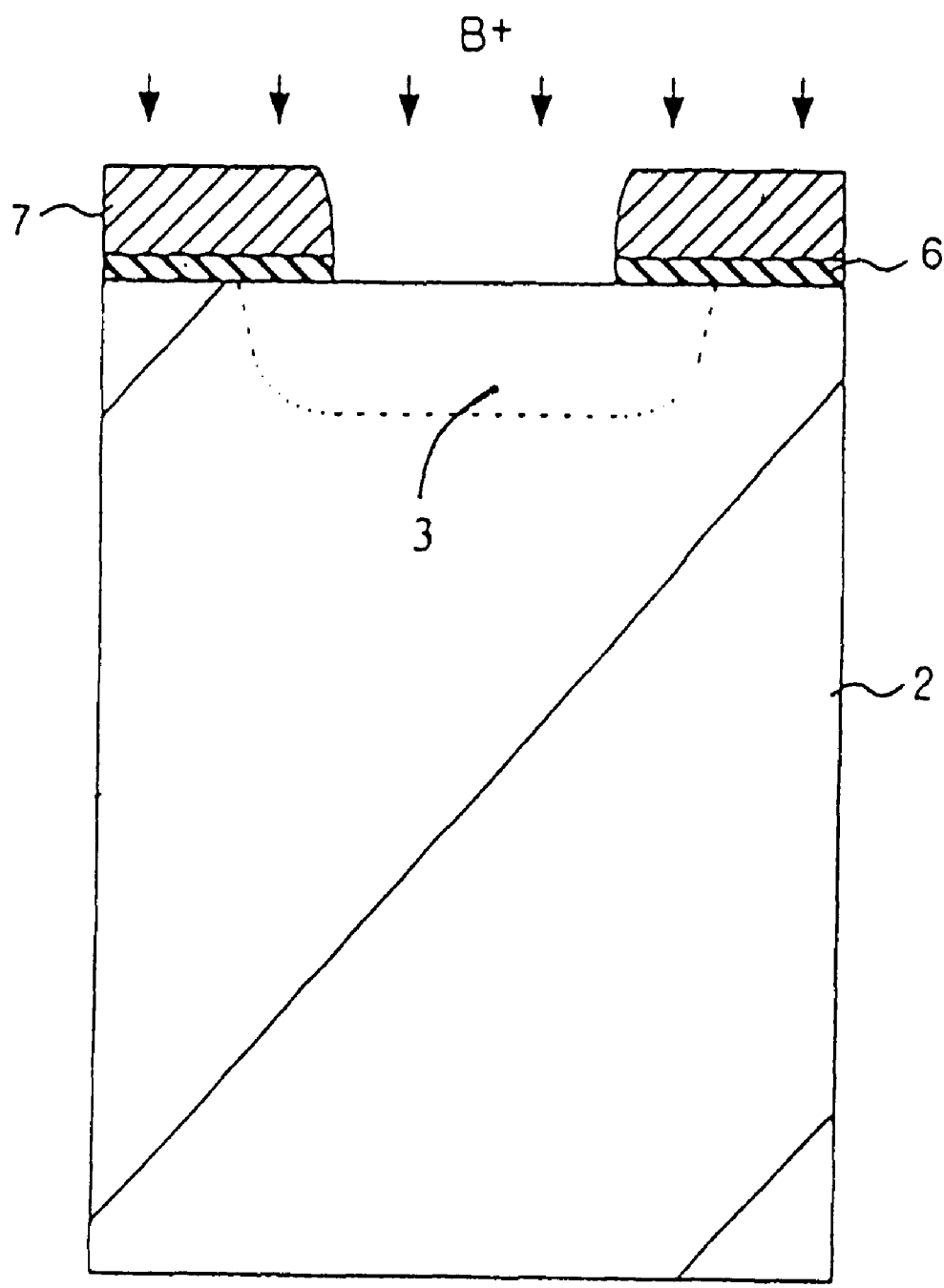
FIG. 3 is a cross-sectional view of an IGBT at a stage of the manufacturing process for an IGBT having the structure shown in FIG. 1.

Now, a manufacturing process of a specific example of an IGBT having structure as shown in FIG. 1 will be described with reference to FIGS. 3 through 8. First, a gate-insulating film 6 is formed on one principal surface of a semiconductor substrate composed, for example, of an FZ wafer having resistivity of 60 $\Omega$cm, for example. On the gate-insulating film 6, polycrystalline silicon is deposited for forming a gate electrode 7. A window is opened in the region corresponding to a channel diffusion region 3 in the gate-insulating film 6 and the gate electrode 7 by photolithography and etching, and boron ions are implanted there. The cross-sectional structure at this stage is shown in FIG. 3.

Figure 4:
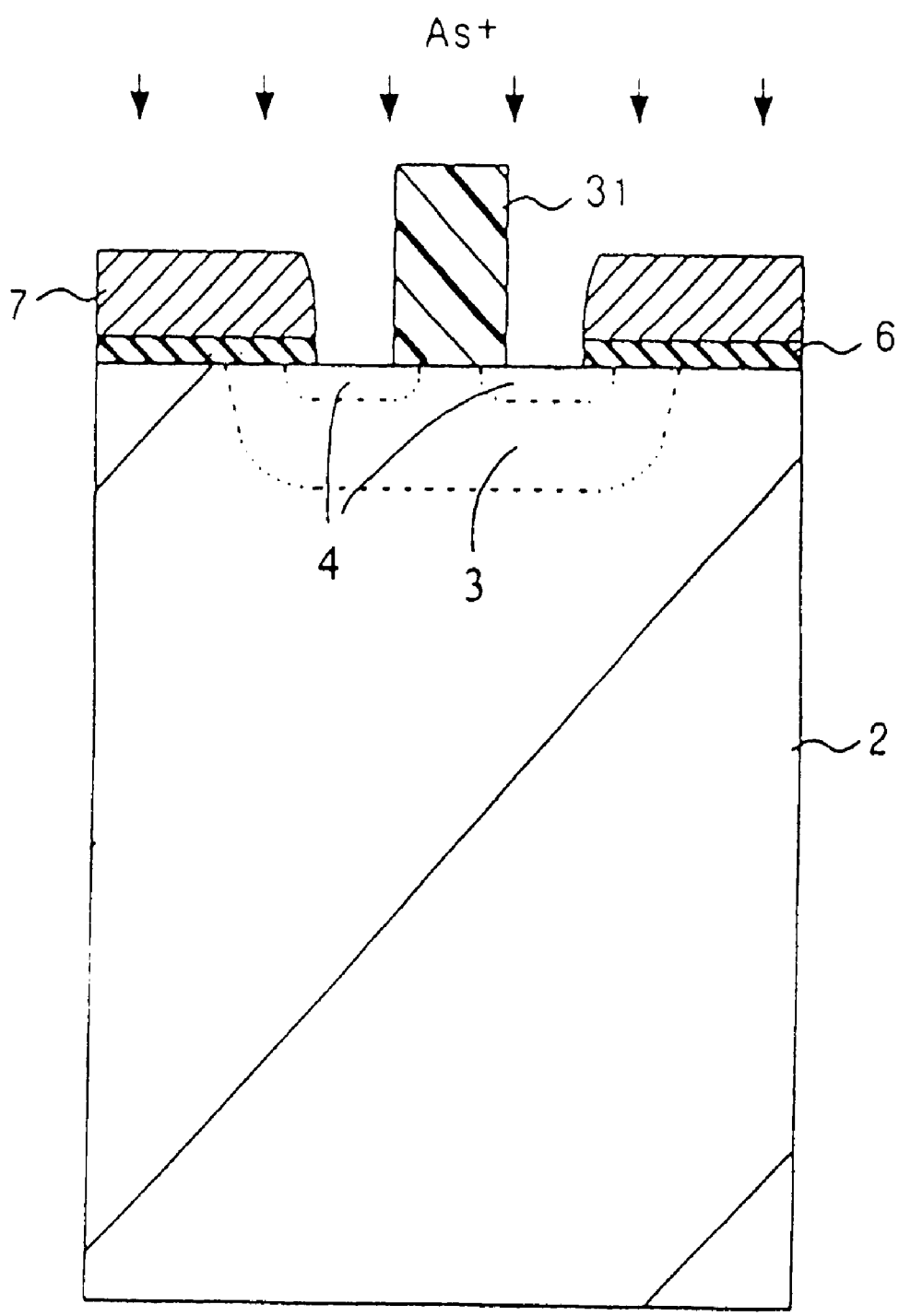
FIG. 4 is a cross-sectional view of an IGBT at a stage of the manufacturing process for an IGBT having the structure shown in FIG. 1.
Figure 5:
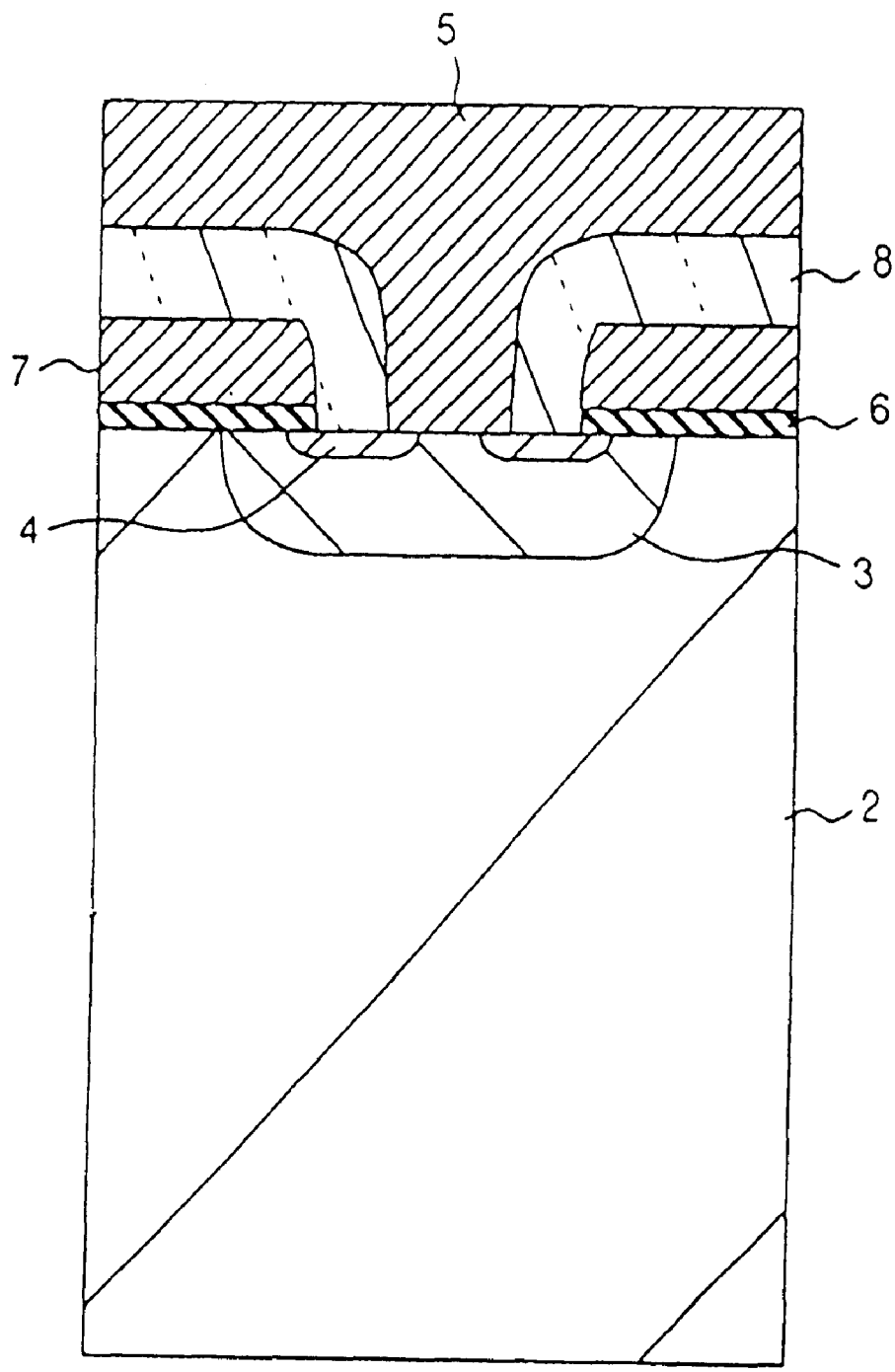
FIG. 5 is a cross-sectional view of an IGBT at a stage of the manufacturing process for an IGBT having the structure shown in FIG. 1.

Subsequently, by patterning a photoresist, a portion of the photoresist 31 is remained in the central portion of the window corresponding to the channel diffusion region 3. Using the photoresist 31 as a mask, arsenic ions are implanted into the channel diffusion region 3. The cross-sectional structure at this stage is shown in FIG. 4. After removing the photoresist 31, heat treatment is conducted to recover from the damage caused by the ion implantation and to activate the implanted ions, resulting in formation of the channel diffusion region 3 and an emitter diffusion region 4. Then, an insulator film 8 is laminated. By etching the insulator film 8, a portion of the channel diffusion region 3 and a portion of the emitter diffusion region 4 are exposed. Then an emitter electrode 5 of aluminum, for example, is laminated. The cross-sectional structure at this stage is shown in FIG. 5.

The resulted wafer is ground and polished from the other principal surface of the substrate to a thickness of 120 $\mu$m. The center line average height Ra of the polished surface is controlled to be not larger than 1 μm, and the filtered center line waviness Wca of the polished surface is controlled to be not more than 10 μm. The wafer is then mounted to a single wafer processing spinning cleaner with the polished surface that is the surface to be cleaned upward, and is cleaned selectively on the polished surface of the wafer using a detergent of an ammonia-hydrogen peroxide mixture, to remove particles attached on the wafer surface.

Figure 6:
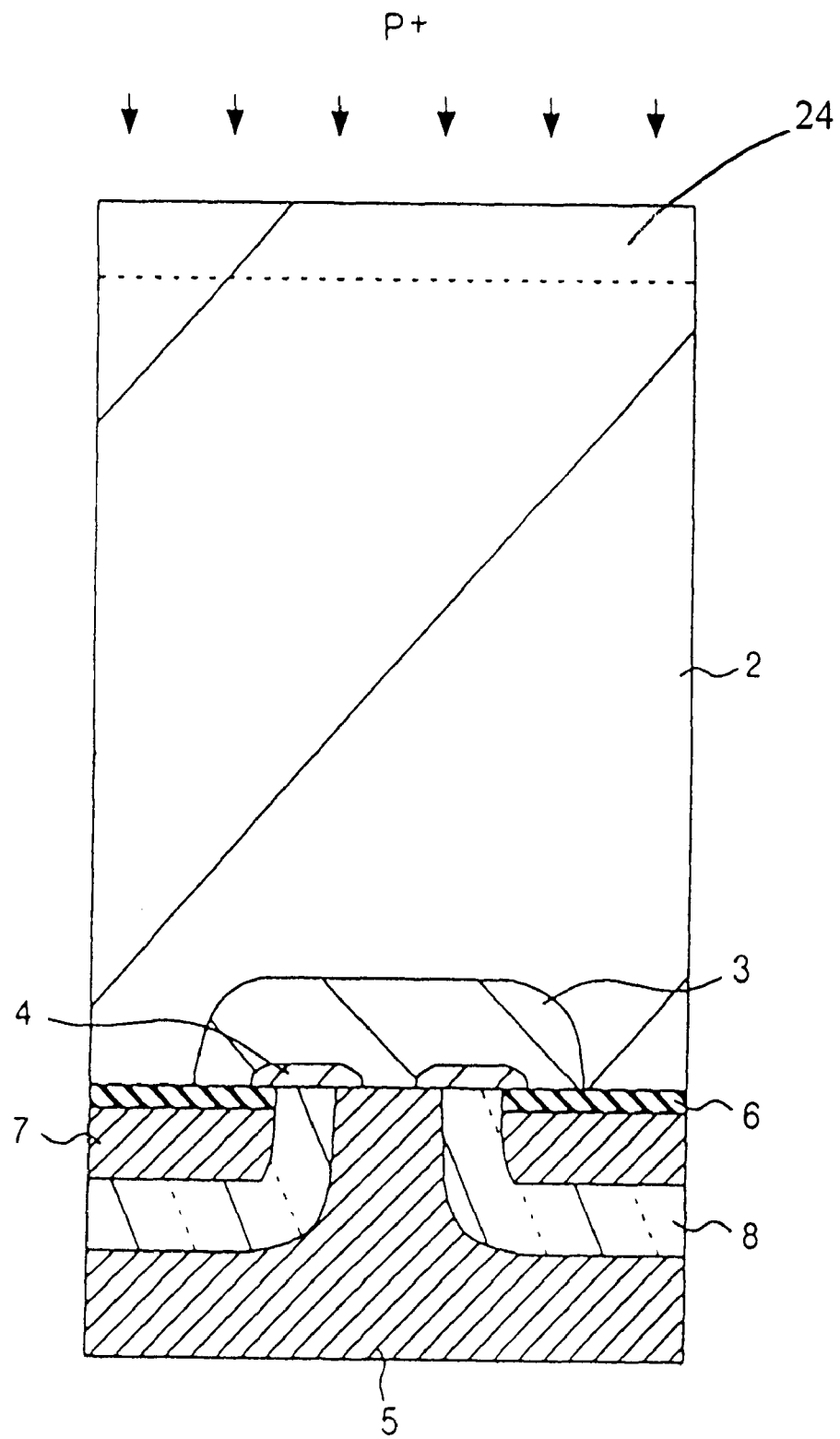
FIG. 6 is a cross-sectional view of an IGBT at a stage of the manufacturing process for an IGBT having the structure shown in FIG. 1.

Only the polished surface is selectively cleaned because the opposite surface is already provided with an emitter electrode 5 and other parts. After that, into the cleaned surface, phosphorus ions are implanted with an acceleration energy of 100 keV or more, to form a field-stop layer 24. The cross-sectional structure at this stage is shown in FIG. 6.

Figure 7:
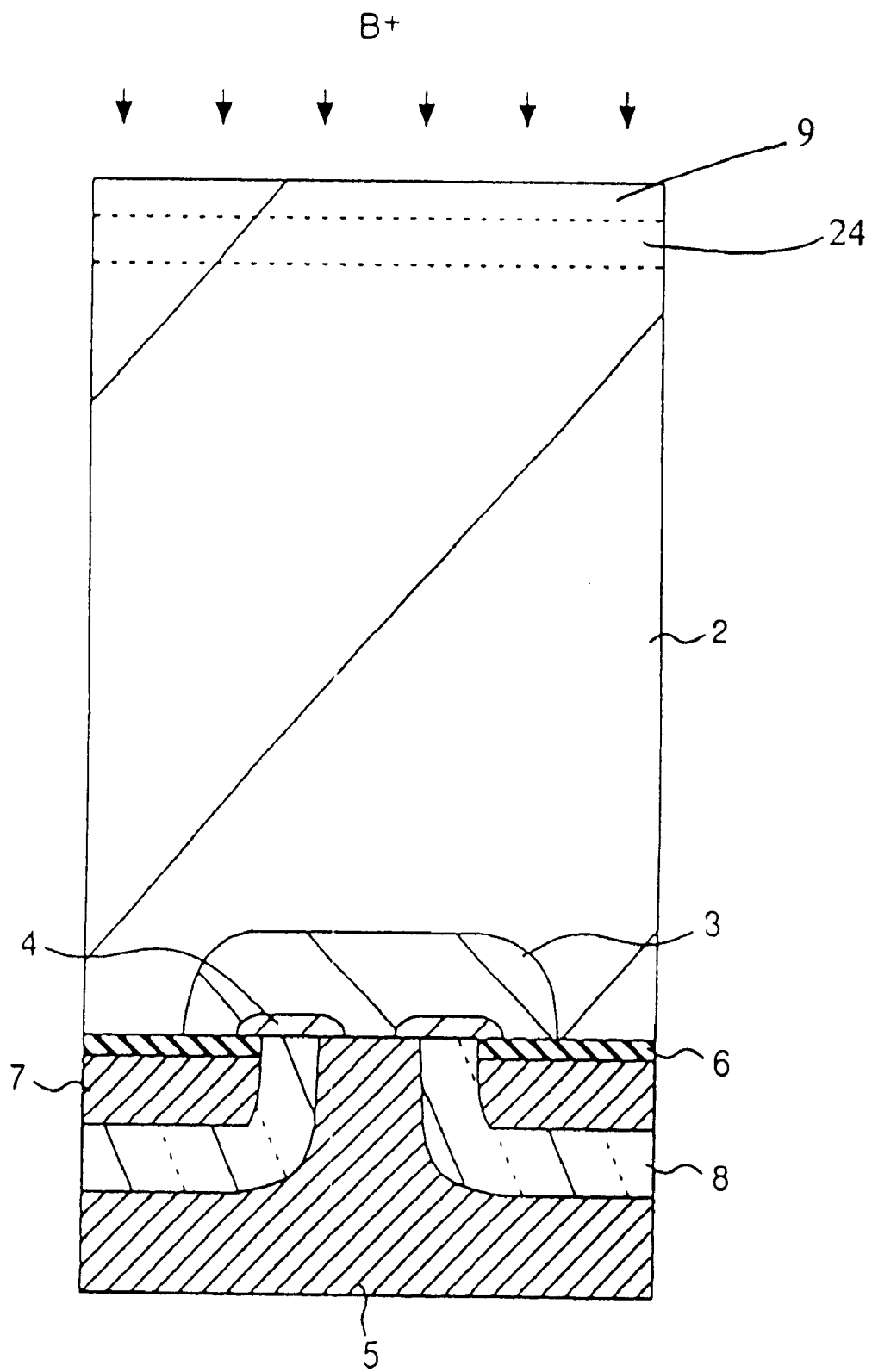
FIG. 7 is a cross-sectional view of an IGBT at a stage of the manufacturing process for an IGBT having the structure shown in FIG. 1.

Subsequently, boron ions are implanted to form a collector layer 9. The acceleration energy and the incident angle in the ion implantation at this step are adjusted such that the range of the boron ions is shorter than that of the previously implanted phosphorus ions. The dose is controlled such that the impurity concentration in the collector layer 9 is larger than the impurity concentration in the field-stop layer 24, as shown in FIG. 2. The temperature of the wafer when boron ions are implanted is preferably lower than room temperature. Boron ions may be further implanted to the surface region of the collector layer 9 in order to form a contact layer with higher concentration than that of the collector layer 9. The contact layer may be formed by implanting $BF_2^+$ ions in place of the boron ions. The acceleration energy and the incident angle are adjusted such that the range of the ions for the contact layer is shorter than that of the previously implanted boron ions for the collector layer. FIG. 7 shows the cross-section at this stage.

Figure 8:
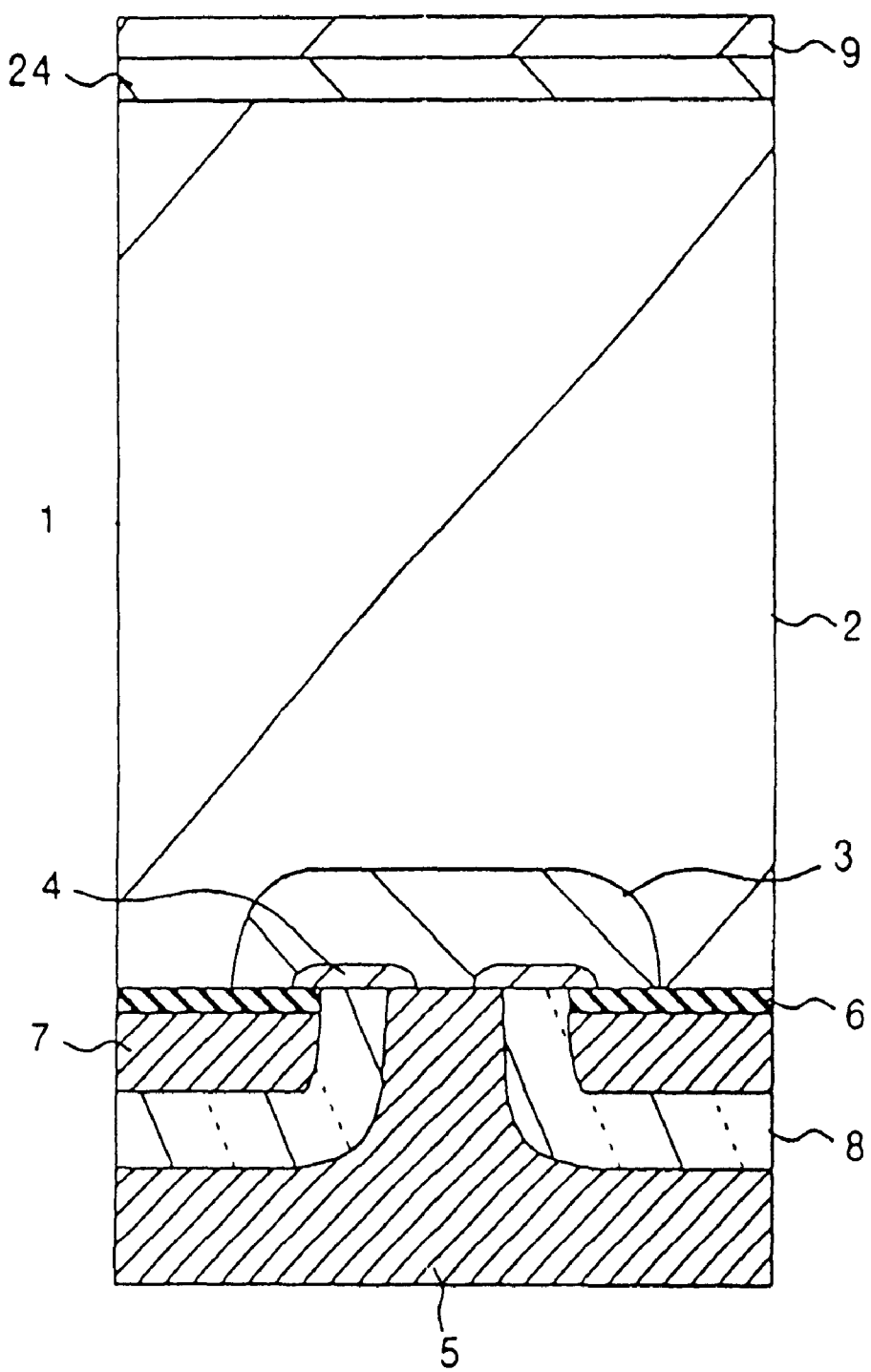
FIG. 8 is a cross-sectional view of an IGBT at a stage of the manufacturing process for an IGBT having the structure shown in FIG. 1.

After that, the wafer is put into a diffusion furnace for example, and subjected to a heat treatment in order to recover from a damage caused by the ion implantation and to activate the implanted ions. The heat treatment is conducted at a temperature that does not cause melting of the emitter electrode or increase of the contact resistance, for example, at a temperature from 300° C. to 550° C. when the emitter electrode is made of aluminum. Thus, a field-stop layer 24, a collector layer 9, and a contact layer that is not shown, are formed as shown in FIG. 8. Finally, a collector electrode 10 is deposited on the contact layer. When the collector electrode 10 is formed by laminating a plurality of layers of different metals, aluminum or platinum is preferably first laminated to a thickness of 0.3 μm to 1 μm, for example. Thus, an IGBT having a structure as shown in FIG. 1 is completed.

Figure 9:
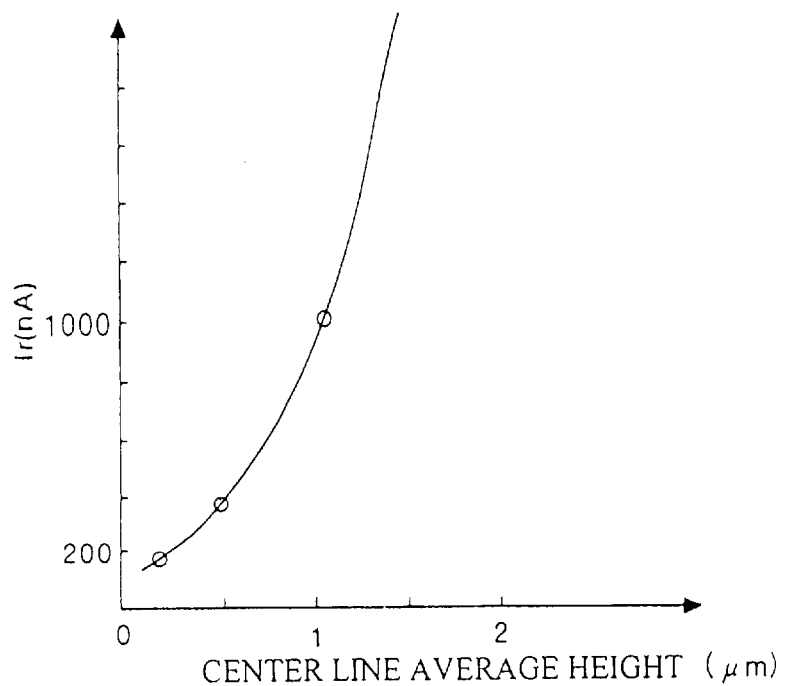
FIG. 9 is a chart showing experimental results on the relationship between leakage current and center line average height on the collector layer surface of an IGBT having the structure shown in FIG. 1.

In the above-described manufacturing process, the center line average height Ra is controlled to be not larger than 1 μm on the surface for forming the collector layer 9 and other parts, the reason for which is explained below. FIG. 9 is a chart showing experimental data on the relationship between the leakage current Ir and the center line average height of the surface of the collector of an IGBT having a structure as shown in FIG. 1. FIG. 9 indicates that if the center line average height Ra is not larger than 1 μm, the leakage current Ir is not larger than 1 mA, which is within the allowable range. Since the leakage current increases exponentially, if the center line average height Ra exceeds 1 μm, the leakage current Ir steeply rises over 1 mA and undesirable thermal runaway becomes likely to occur.

Figure 10:
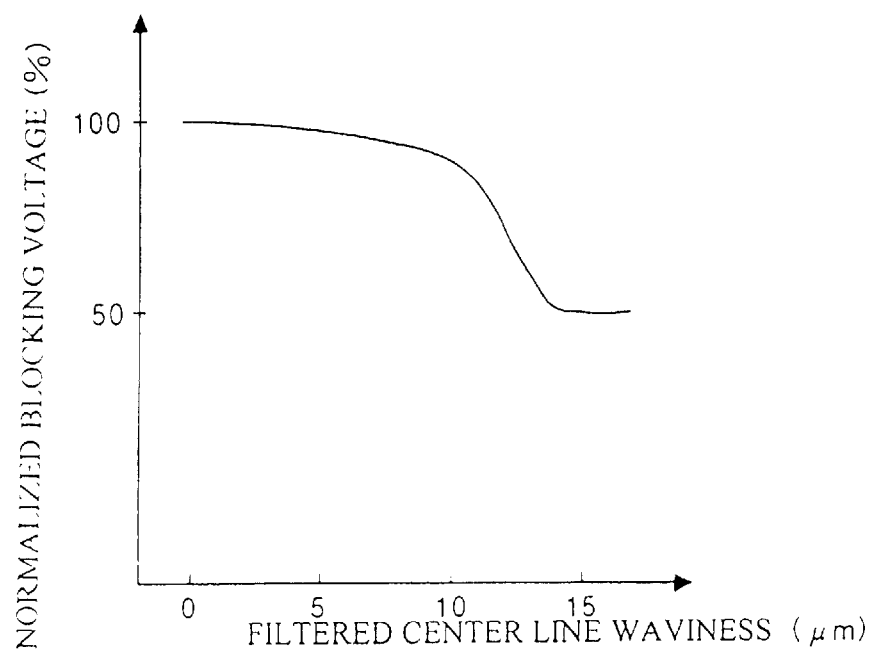
FIG. 10 is a chart showing experimental results on the relationship between normalized blocking voltage and filtered center line waviness of the base layer of an IGBT having the structure shown in FIG. 1.

Next, the reason for the filtered center line waviness Wca on the surface for forming the collector layer 9 and other parts being not larger than 10 μm is explained below. When the base layer 2 is polished to a specified thickness after the emitter electrode 5 is formed in the manufacturing process described above, unevenness is generated on the polished side surface of the wafer corresponding to the irregularity on the surface of the side of the emitter electrode. FIG. 10 shows an experimental result on the relationship between the normalized blocking voltage and the filtered center line waviness in the base layer 2 of an IGBT having a structure as shown in FIG. 1. The FIG. 10 indicates that the decrease in the blocking voltage is insignificant if the filtered center line waviness is not larger than 10 μm. When the waviness exceeds 10 μm, however, the blocking voltage drops abruptly. Accordingly, the filtered centerline waviness Wca is preferably not larger than 10 μm so as to suppress drop of the blocking voltage.

Figure 11:
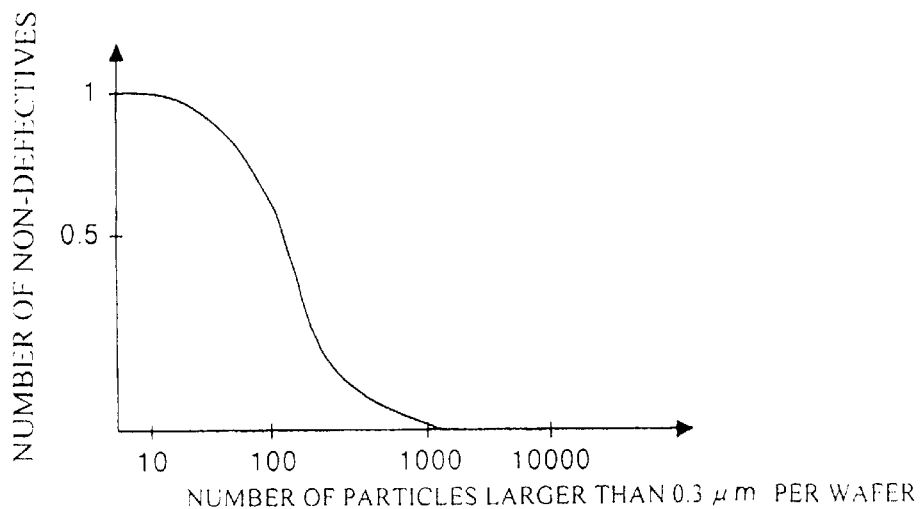
FIG. 11 is a chart showing a result of the study on the relationship between proportion of non-defective units and number of particles greater than 0.3 μm in diameter attached on the ion-implanting surface of an IGBT having the structure shown in FIG. 1.

The reason for the cleaning with an aqueous chemical solution employing an ammonia-hydrogen peroxide mixture prior to the ion implantation is explained in the following. FIG. 11 shows a result of the study on the relationship between the proportion of non-defective IGBTs and the number of the particles larger than 0.3 μm in diameter that are attached on the surface for ion implantation in IGBTs having a structure as shown in FIG. 1. FIG. 11 indicates that with decrease in the number of particles, the proportion of non-defectives rises and the yield improves.

Figure 12:
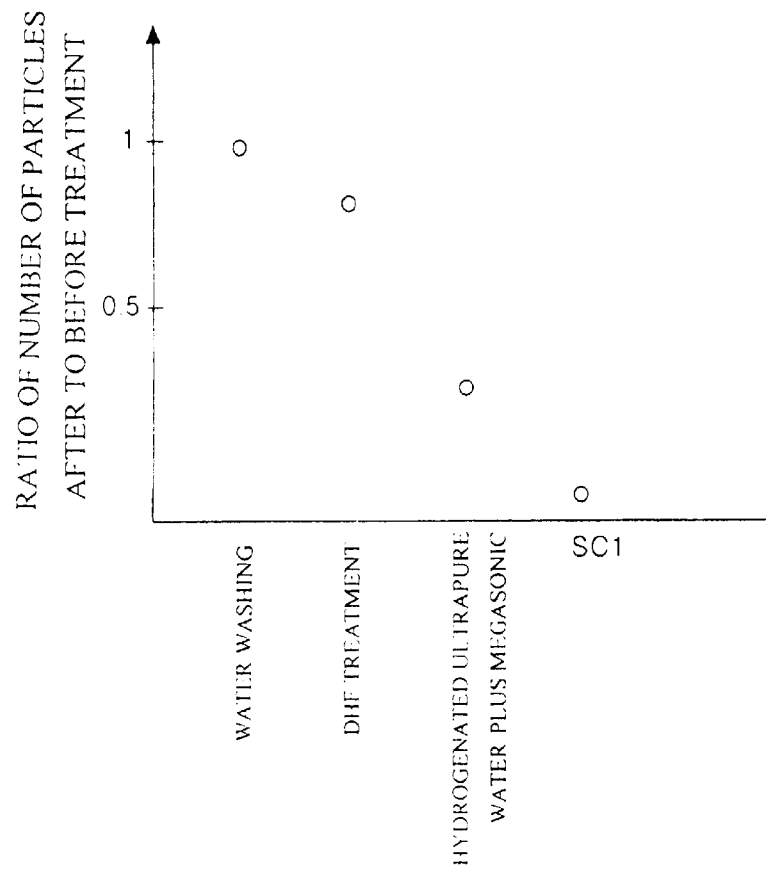
FIG. 12 is a chart showing a result of the study on a relationship between a cleaning method and particle removal effect in an IGBT having the structure shown in FIG. 1.

FIG. 12 shows a result of the study o the relationship between methods for cleaning and particle elimination effect in an IGBT having a structure as shown in FIG. 1. FIG. 12 demonstrates that when a cleaning liquid of an ammonia-hydrogen peroxide mixture, denoted by SCI in the figure, is used, the ratio of the number of particles after cleaning to the number of particles before cleaning is nearly zero, which means almost all the particles are eliminated. Therefore, an ammonia-hydrogen peroxide mixture is an effective cleaning liquid for the rate of non-defective IGBTs to approach unity.

It also can be understood from FIG. 12 that an ultrasonic cleaning is more effective than simple water-washing and DHF treatment. This ultrasonic cleaning washes a wafer surface using functional water consisting of hydrogenated ultrapure water and ozonized ultrapure water in combination with megasonic frequencies. The ultrasonic cleaning also selectively cleans only one surface using a spinning cleaner. Two or more cleaning processes may be conducted combining the cleaning using the ammonia-hydrogen peroxide mixture and the ultrasonic cleaning described above. Any other cleaning liquid exhibiting particle elimination effect may be used in place of the ammonia-hydrogen peroxide mixture.

Figure 13:
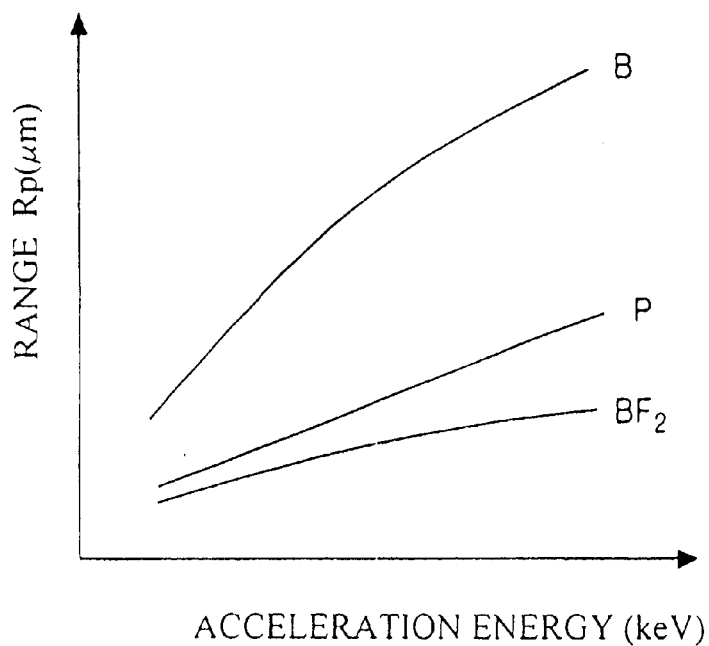
FIG. 13 is a chart showing the relationship between acceleration energy and range in implantation of phosphorus ions, boron ions, and $BF_2^+$ ions.

When ion implantation is conducted for forming a field-stop layer 24, a collector layer 9, and a contact layer, the acceleration energy and the incident angle of the ions are adjusted to obtain the desired range. FIG. 13 shows relationship between the acceleration energy and the range in implantation of phosphorus ions, boron ions, and $BF_2^+$ ions. Since boron, having the mass number of 11, is light, the range Rp is large even at a low acceleration energy. In contrast, the range of phosphorus having the mass number of 31 is about one-third to a half of the range of boron at the same acceleration energy. The range of $BF_2^+$ having the mass number of 49 is about one fourth of the range of boron at the same acceleration energy.

Figure 14:
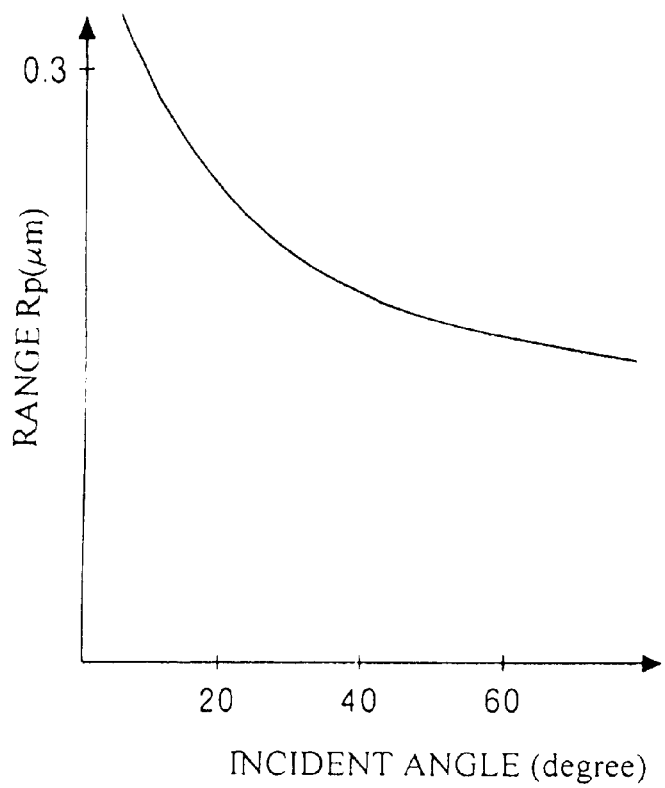
FIG. 14 is a chart showing the relationship between incident angle and range in implanting boron ions.

FIG. 14 shows relationship between the range and the incident angle of boron ions implanted at the acceleration energy of 100 keV. It is known from the FIG. 14 that the range Rp can be controlled by varying incident angle of the implanted ions relative to the crystal orientation of silicon.

Consequently, a proper condition for the ion implantation can be found based on the relationship between the acceleration energy and the range and the relationship between the incident angle and the range when the above-described manufacturing process is executed.

Figure 15:
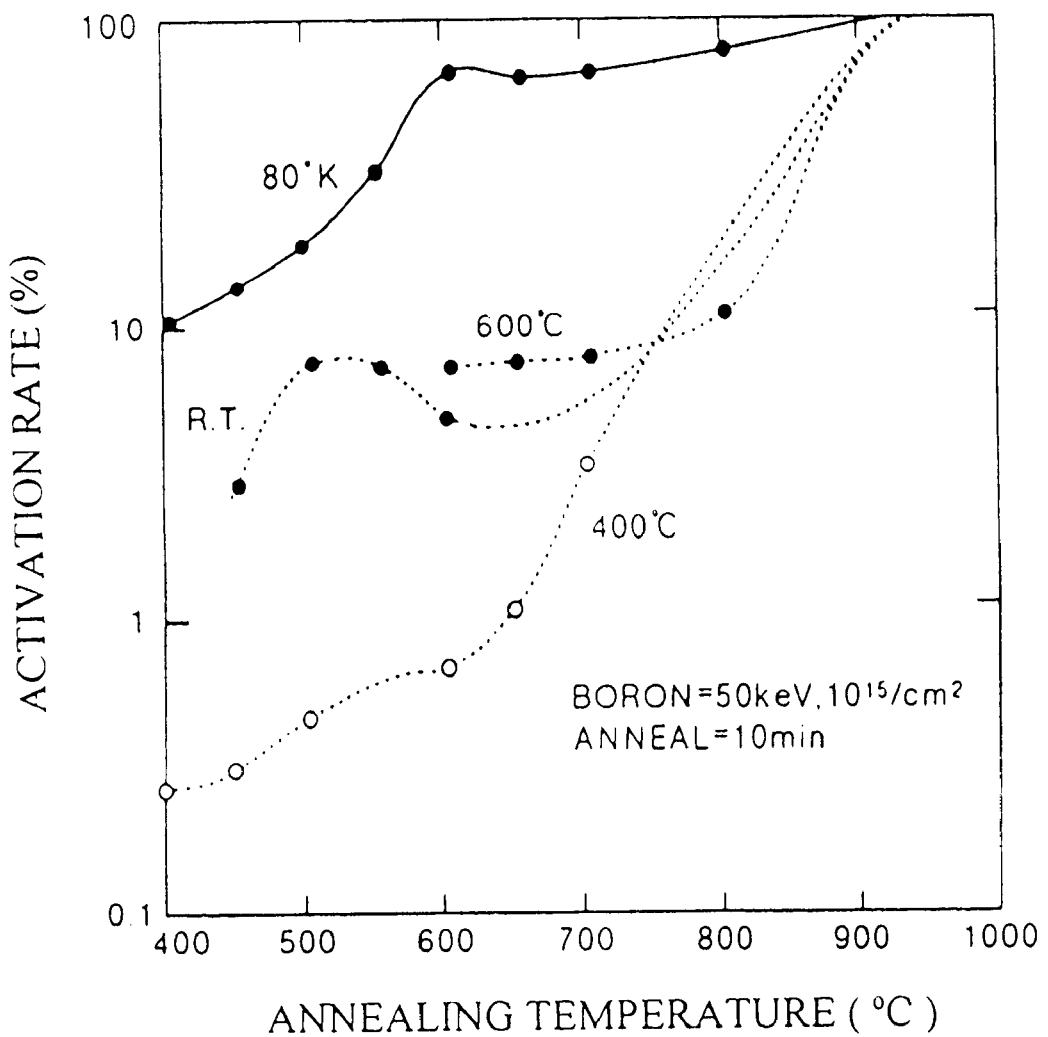
FIG. 15 is a chart showing the relationship among activation rate, annealing temperature, and wafer temperature in implanting boron ions.

Next, explained is the reason for implanting boron ions at a temperature lower than the room temperature. FIG. 15 shows relationship between the activation rate and the temperature of annealing for 10 minutes after boron ion implantation at various wafer temperatures with the acceleration energy of 50 keV and the dose of $1\times10^{15}$ cm$^{-2}$. FIG. 15 indicates that the activation rate enhances with elevation of the annealing temperature. It is also demonstrated that the activation rate of the boron ions is about one order or more of magnitude higher when activation by annealing is conducted after ion implantation at a temperature lower than the room temperature, for example as low as 80 K, than the case in which activation by annealing is conducted after ion implantation at room temperature or higher temperature.

Total dose of phosphorus in the field-stop layer 24 is increased for the IGBTs exhibiting higher blocking voltage that have a structure as shown in FIG. 1. Because the impurity concentration of the collector layer needs to be higher than that of the field-stop layer as described earlier, the total dose of boron in the collector layer 9 also needs to be increased corresponding to the increase of the total dose of phosphorus in the field-stop layer. However, there is a limiting amount of boron ions that can be implanted, and the annealing temperature is also limited to about 550° C. so as to prevent the emitter electrode from melting and to avoid excessive contact resistance. Taking into account the above conditions, a low temperature implantation of boron ions is effective to obtain high boron concentration in the collector layer 9 without increasing the dose in the collector layer nor elevating the annealing temperature, because the low temperature implantation at 80 K, for example, gives an activation rate of 15% to 60% even with annealing temperature of 400–550° C.

Figure 16:
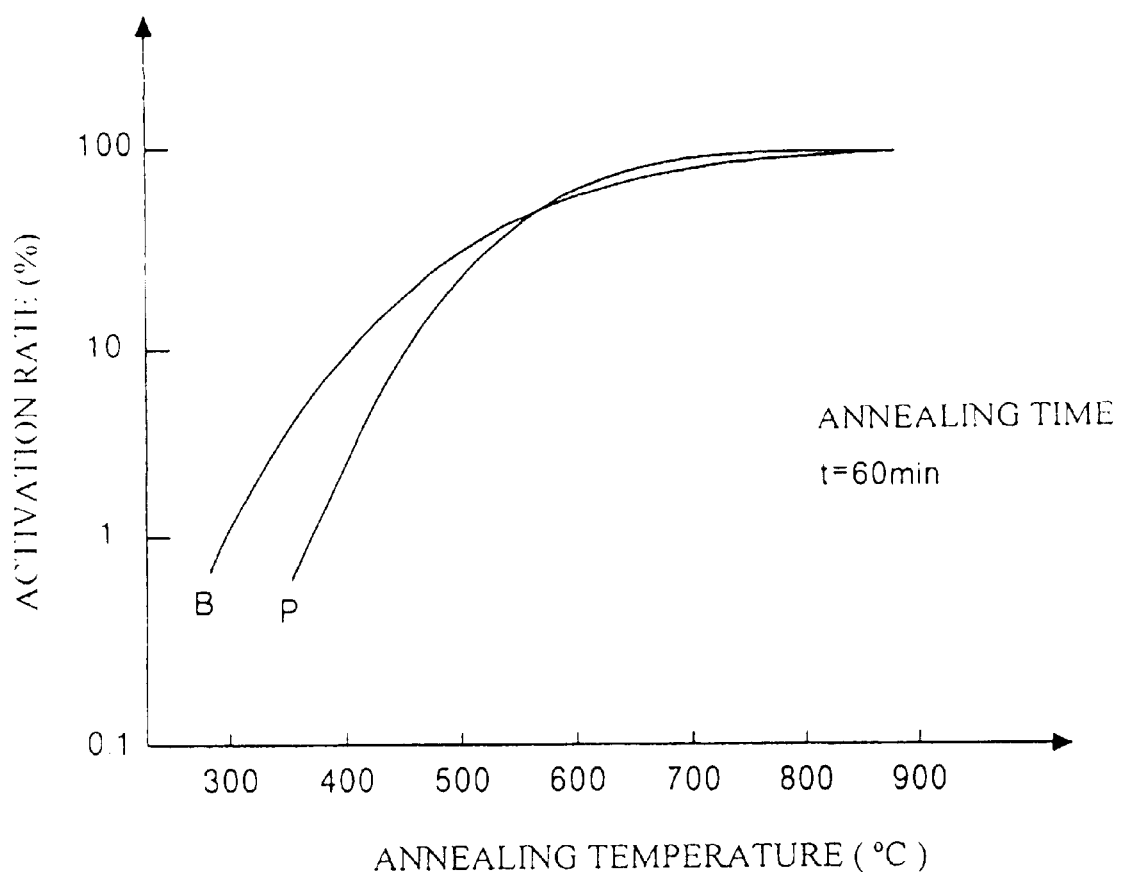
FIG. 16 is a chart showing the relationship between activation rate and the temperature in diffusion furnace annealing of phosphorus and boron.

The reason is given in the following for the favorable annealing temperature range of 300° C. to 550° C. in the heat treatment after implanting phosphorus ions for forming the field-stop layer 24 and boron ions for forming the collector layer 9. One of the reasons is for preventing the emitter electrode 5 from melting and avoiding excessive contact resistance. One of the other reasons of the upper limit, 550° C., is to suppress the activation rate of phosphorus within 15% in order to make the boron concentration higher than the phosphorus concentration. FIG. 16 shows a relationship between the activation rate and the temperature in diffusion furnace annealing of phosphorus and boron. FIG. 16 indicates that the activation rate of phosphorus is not more than 15%. at temperature not more than 550° C. The above-mentioned lower limit, 300° C., is based on the fact that phosphorus does not activate below 300° C.

Figure 17:
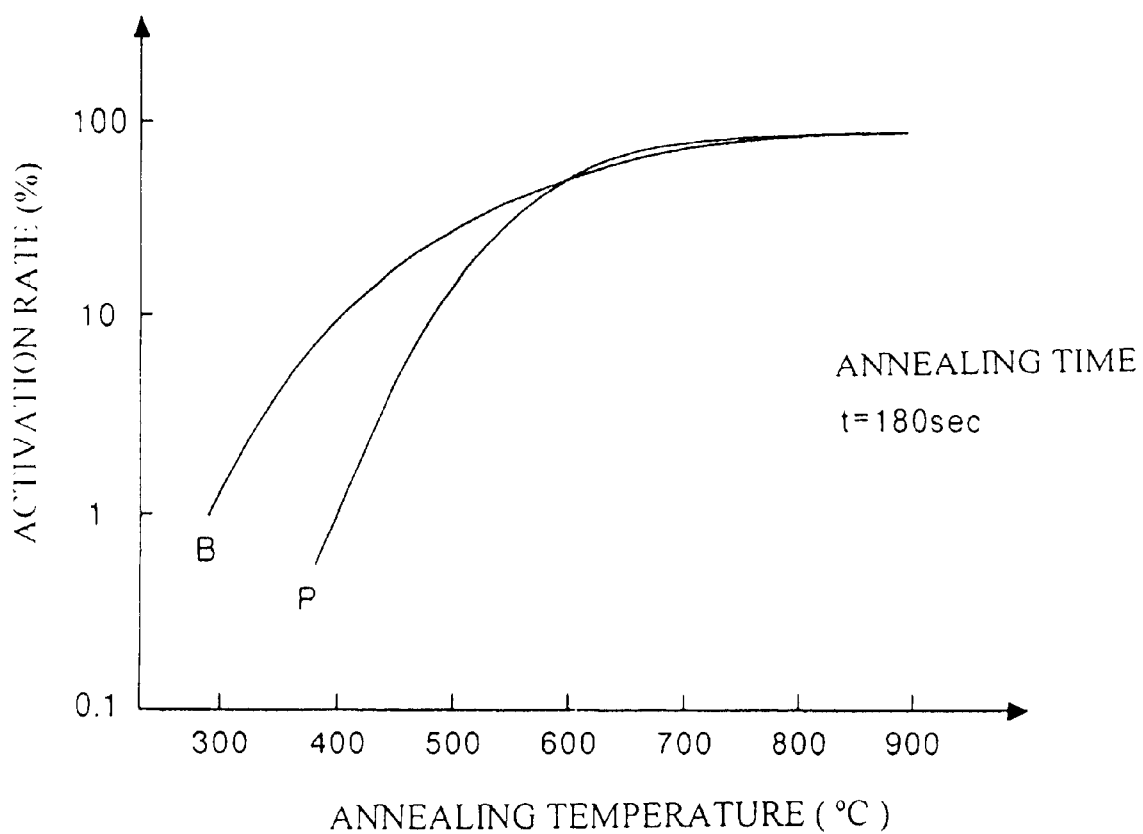
FIG. 17 is a chart showing the relationship between activation rate and the temperature in rapid thermal annealing of phosphorus and boron.

The annealing may be performed by a lamp annealing method, that is a rapid thermal annealing, in place of a method that uses a diffusion furnace. Preferable annealing temperature in this lamp annealing method is in the range from 300° C. to 600° C. The reason for the range is similar to the above-mentioned annealing using a diffusion furnace. The upper limit value, 600° C., in particular, is based on the fact that the activation rate of phosphorus by rapid thermal annealing is not larger than 15% even at the temperature of 600° C. FIG. 17 shows a relationship between the annealing temperature and the activation rate of phosphorus and boron in rapid thermal annealing.

The annealing may be performed by a laser annealing method in place of a method that uses a diffusion furnace. The wavelength of the laser light used in this method is in the range from 150 nm to 1,060 nm. Specific examples of the laser for this purpose include a KrF laser of 248 nm, an XeCl laser of 308 nm, an XeF laser of 351 nm, second harmonics of a YAG laser of 532 nm, and a YAG laser of 1,060 nm. The irradiation energy density is in the range from 0.5 to 3 J/cm$^2$. Irradiation energy density higher than the upper limit 3 J/cm$^2$ causes roughness, specifically center line average height, larger than 1 μm on the surface of the collector layer irradiated by the laser light. The centerline average height larger than 1 μm causes abrupt rise of leakage current Ir over 1 mA, which is undesirable as described earlier with reference to FIG. 9.

Figure 18:
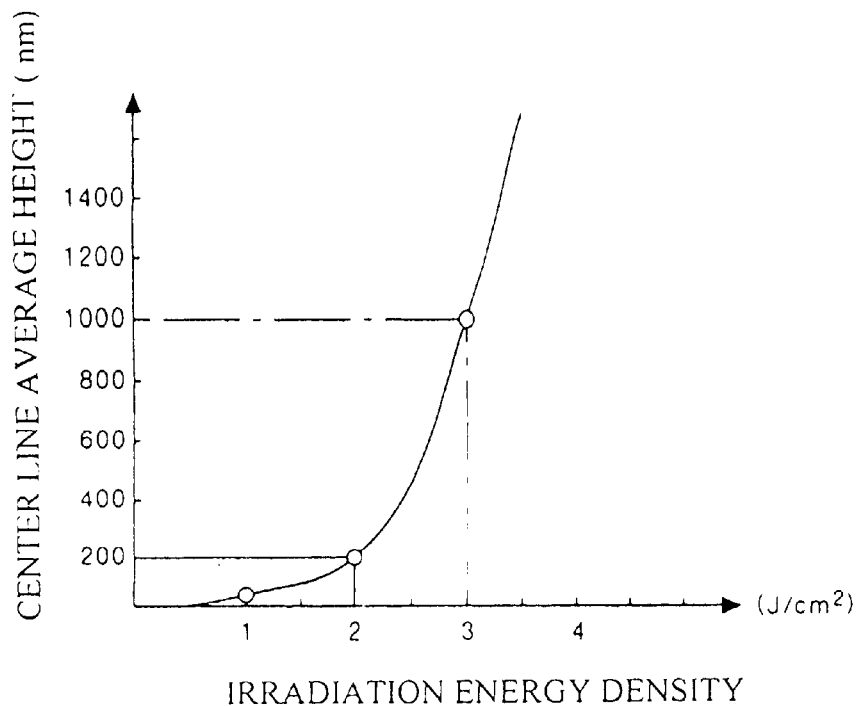
FIG. 18 is a chart showing a result of the study on relationship between center line average height and irradiation energy density in laser annealing.
Figure 19:
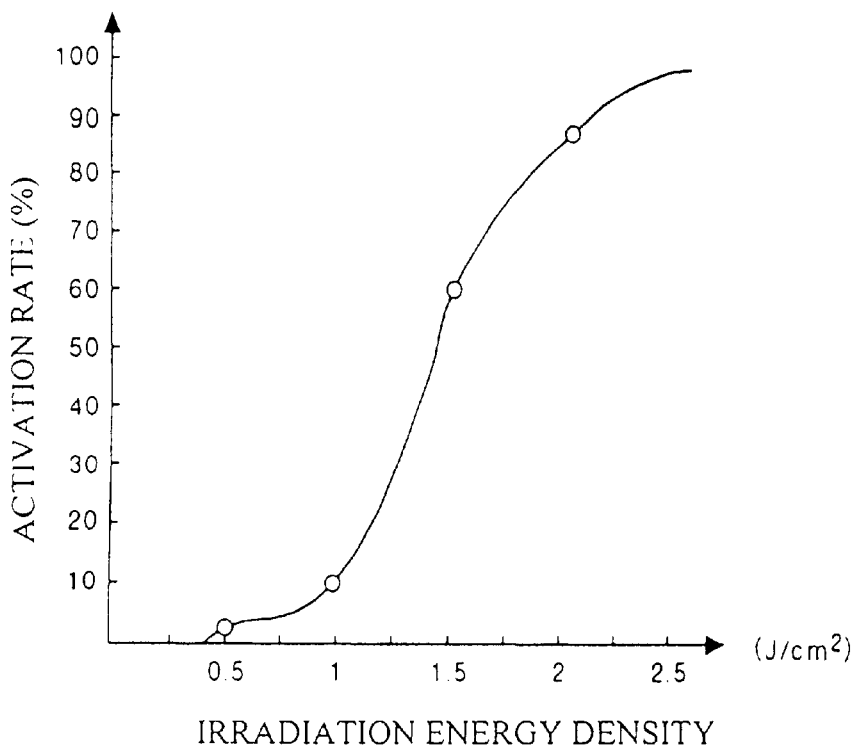
FIG. 19 is a chart showing a result of the study on relationship between activation rate of impurity boron and irradiation energy density in laser annealing.

FIG. 18 shows a result of the study on the relationship between the irradiation energy density and the center line average height in laser annealing. The lower limit 0.5 J/cm$^2$ is based on the fact that the irradiation with energy density lower than this value does not activate the implanted ions. FIG. 19 shows a result of the study on the relationship between the irradiation energy density and the activation rate of the impurity boron in laser annealing.

Figure 20:
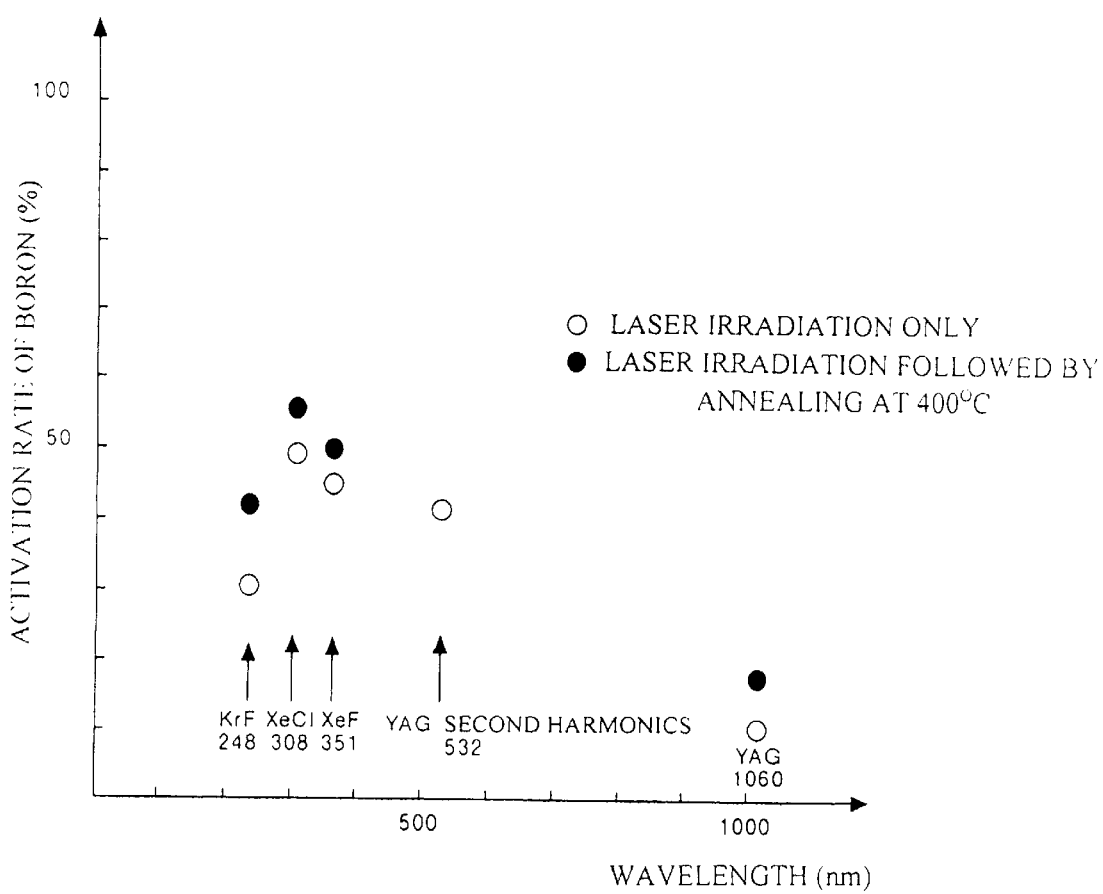
FIG. 20 is a chart showing a result of the comparison between the activation rate of boron obtained by laser annealing only and the activation rate achieved by the combination of laser annealing and diffusion furnace annealing.

Besides employing a single method, the annealing may be also performed combining two or three methods selected from above-described methods: annealing using a diffusion furnace, rapid thermal annealing, and laser annealing. FIG. 20 shows comparison between the activation rate of boron obtained by laser annealing only and the activation rate achieved by the combination of laser annealing and diffusion furnace annealing. It is demonstrated that the activation rate is higher in the combination of laser annealing and diffusion furnace annealing than in the single process of laser annealing, for every laser annealing of a KrF laser of 248 nm, an XeCl laser of 308 nm, an XeF laser of 351 nm, and a YAG laser of 1,060 nm.

Because characteristics of an IGBT having a structure as shown in FIG. 1 depend on an injection of holes from the collector layer 9, the quantity of boron in the collector layer needs to be controlled. When the minimum roughness on the surface of the collector layer 9 is intended in the activation process of the boron, the combination of laser annealing with diffusion furnace annealing gives an enhanced activation rate, and thus facilitates to control the saturation voltage V$_{CE}$(sat) between collector and emitter. In FIG. 20, the data have been obtained with the irradiation energy density of 1.3 J/cm$^2$ and the temperature of diffusion furnace annealing at 400° C.

Figure 21:
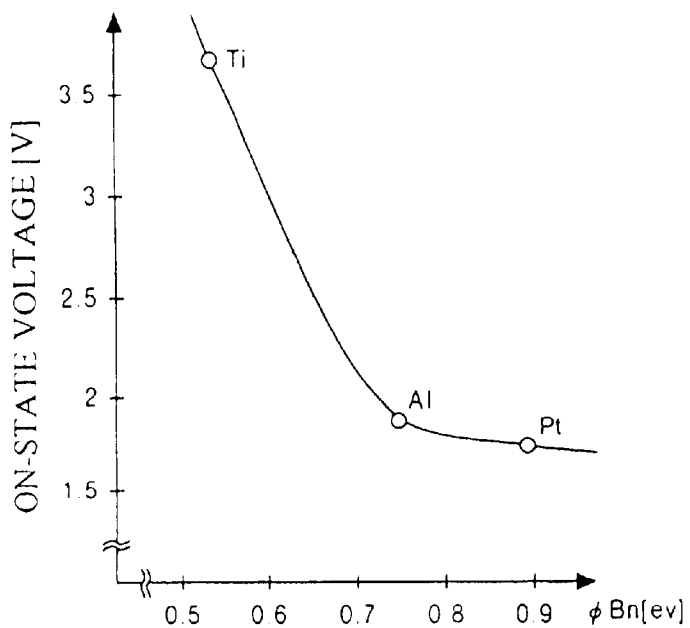
FIG. 21 is a chart showing a result of the study on the relationship between on-state voltage and barrier height $\phi_{Bn}$ of collector electrode materials.

The reason is given below for employing aluminum or platinum in the portion of the collector electrode 10 that contact with semiconductor material. FIG. 21 is a chart showing relation between on-state voltage and barrier height $\phi_{Bn}$ of some collector electrode materials: aluminum, platinum and titanium. FIG. 21 indicates that aluminum and platinum exhibit higher barrier height to an n-type semiconductor than titanium. In other words, aluminum and platinum have low barrier height to a p-type semiconductor, and allow low on-state voltage.

Figure 22:
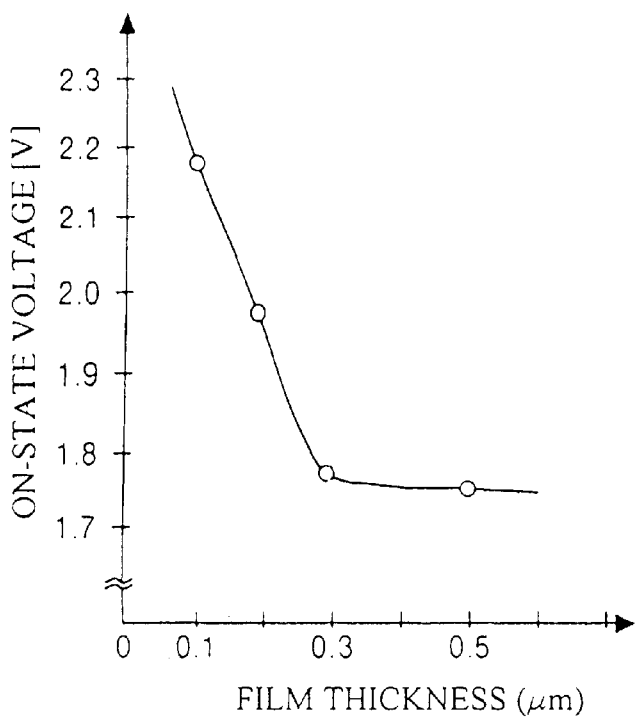
FIG. 22 is a chart showing a result of the study on the relationship between on-state voltage and film thickness of a collector electrode material, aluminum.

Because the collector layer 9 and the contact layer of an IGBT having a structure as shown in FIG. 1 have low impurity concentration and exhibit excessively high barrier height in contact with titanium, these layers needs to employ aluminum or platinum. The reason for the thickness of aluminum or platinum of not smaller than 0.3 μm is because the on-state voltage is too high when the thickness is smaller than 0.3 μm. FIG. 22 shows a result of the study on relation between on-state voltage and thickness of a collector electrode material, aluminum. When the thickness of the aluminum film increases beyond 0.5 µm, the on-state voltage approaches to a value between 1.7 V and 1.8 V. Consequently, any upper limit of film thickness of aluminum or platinum need not be fixed. Nevertheless, taking costs and deposition time into account, and considering that too thick film causes warping, the thickness is appropriately not more than 1 µm, for example.

Figure 23:
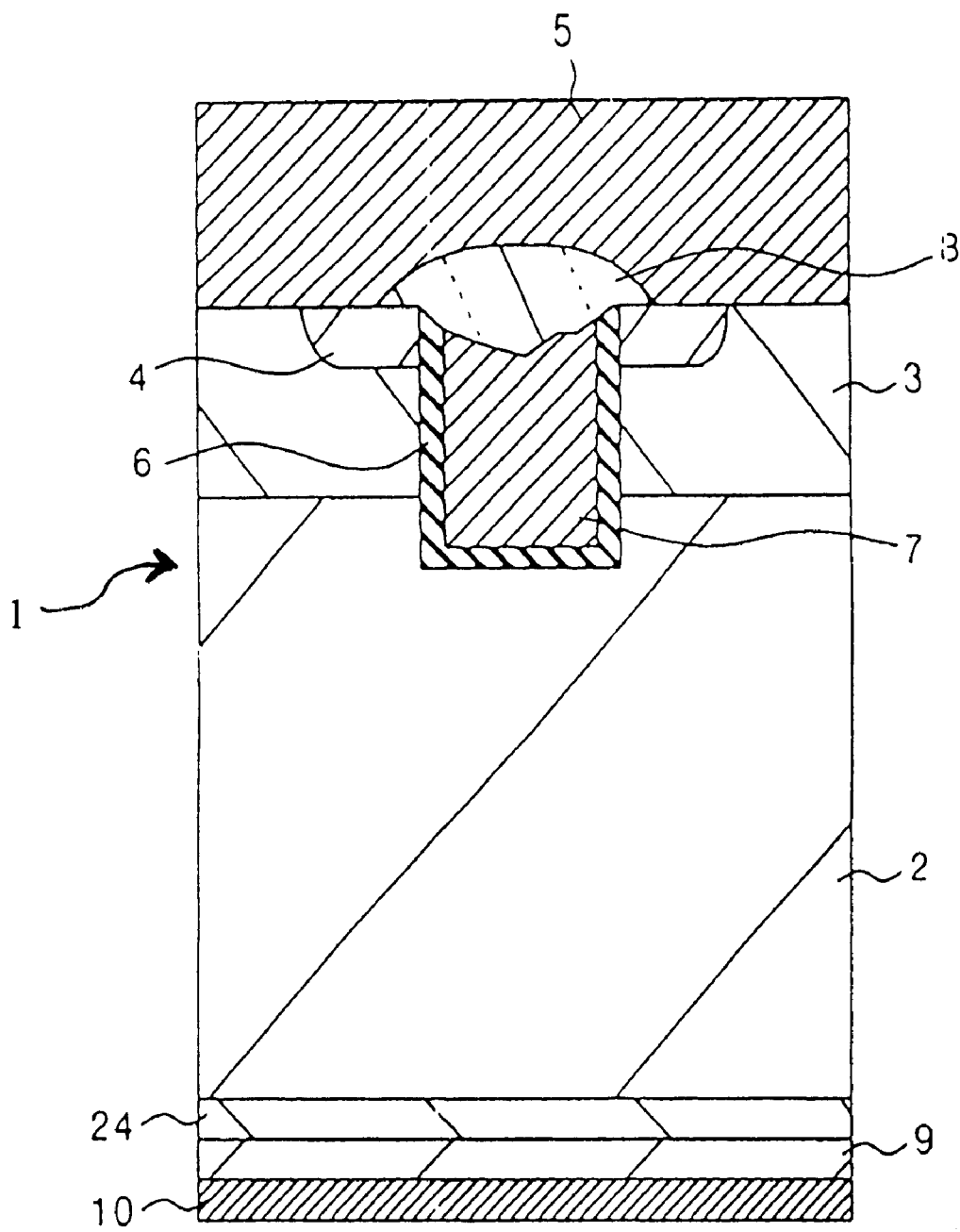
FIG. 23 is a cross-sectional view of another example of a semiconductor device manufactured by a manufacturing method according to the present invention.

FIG. 23 is a cross-sectional view of another example of a semiconductor device manufactured by a method according to the present invention. This semiconductor device is an IGBT having a trench gate structure. The base layer 2 is composed of an n-type semiconductor substrate made of a silicon FZ wafer. On a surface of the base layer 2, a p-type channel diffusion region 3 is fanned. In the channel diffusion region 3, an n-type emitter diffusion region 4 is formed. In the central portion of the channel diffusion region 3. a trench is formed through the emitter diffusion region 4. A gate electrode 7 is formed in this trench through a gate-insulating film 6 that coats inner surface of the trench.

An emitter electrode 5 is electrically connected to the channel diffusion region 3 and the emitter diffusion region 4, and insulated from the gate electrode 7 through an insulator film 8. In a shallow portion of the reverse surface region of the base layer 2, a field-stop layer 24 is formed. A p-type collector layer 9 is formed in the portion of the reverse surface region shallower than the field-stop layer 24. A collector electrode 10 is formed on the collector layer 9.

The IGBT shown in FIG. 23 is different from the IGBT shown in FIG. 1 only in that the IGBT in FIG. 23 has a trench gate structure while the IGBT in FIG. 1 has a planar gate structure. Thus, in the IGBT of FIG. 23, the thickness Xfs–Xj of the field-stop layer 24 is from 0.5 µm to 3 µm.

Figure 24:
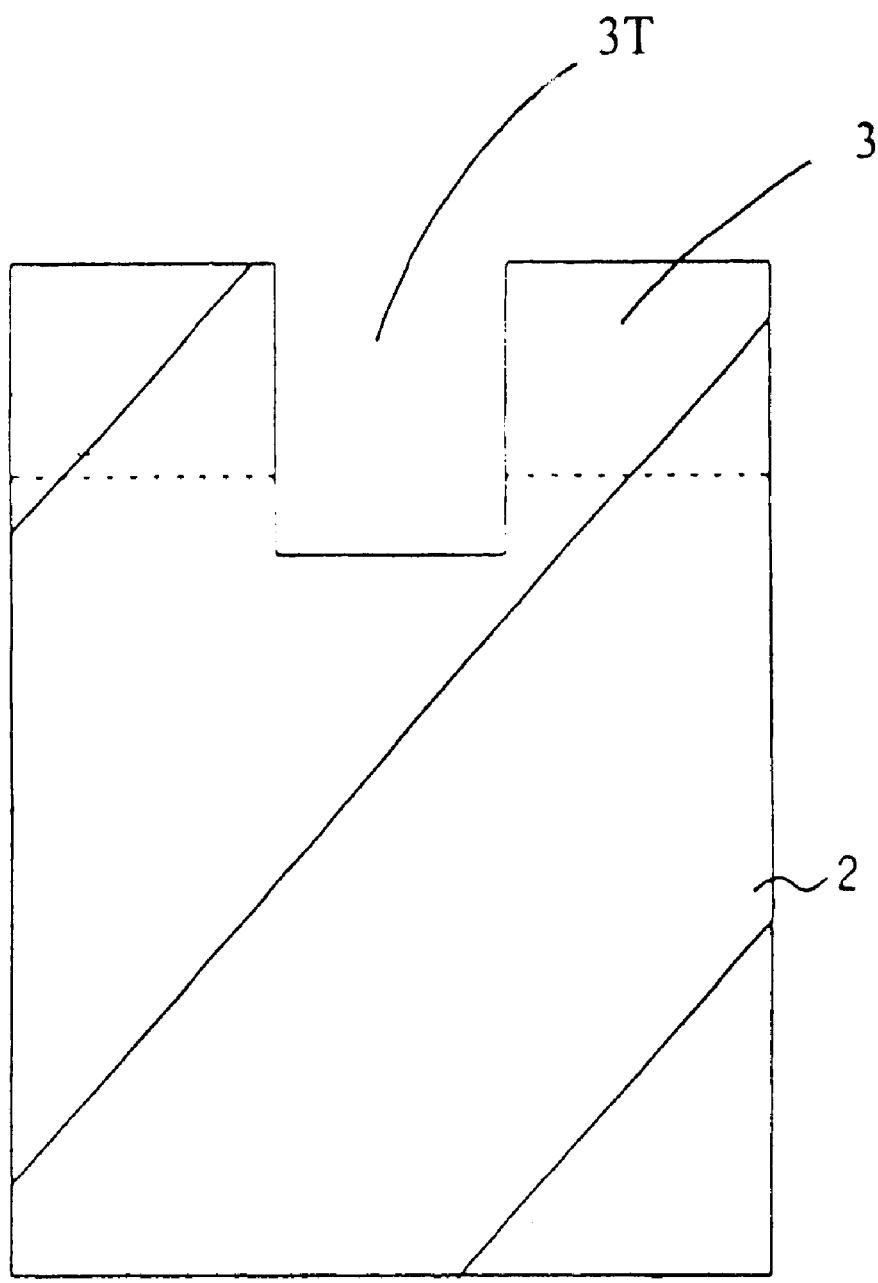
FIG. 24 is a cross-sectional view of an IGBT at a stage of the manufacturing process for an IGBT having the structure shown in FIG. 23.

Now, a manufacturing process of an IGBT having a structure as shown in FIG. 23 will be described referring to FIGS. 24 through 29. First, boron ions for forming a channel diffusion region 3 are implanted into one principal surface of a semiconductor substrate composed of an FZ wafer having resistivity of 60 Ωem, for example. Then, a trench 3T is formed by photolithography and etching. The cross-sectional structure at this stage is shown in FIG. 24.

Figure 25:
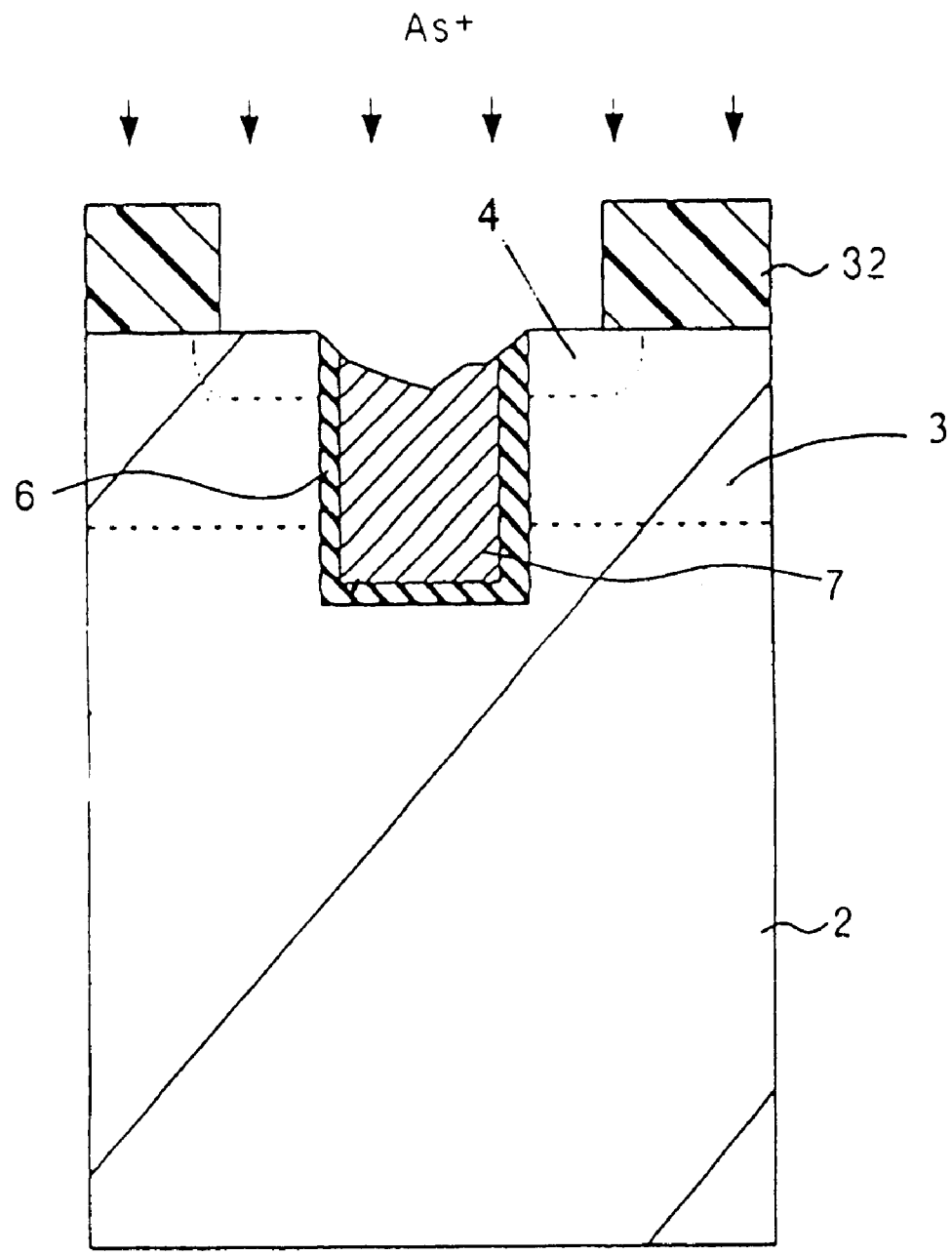
FIG. 25 is a cross-sectional view of an IGBT at a stage of the manufacturing process for an IGBT having the structure shown in FIG. 23.

A gate-insulating film 6 is then deposited. On this insulating film, polycrystalline silicon is deposited for forming a gate electrode 7. The gate-insulating film and the polycrystalline silicon outside of the trench are removed, leaving the gate-insulating film 6 and the gate electrode 7 in the trench. Photoresist is then applied and, by patterning, windows are opened in the regions corresponding to the emitter diffusion region 4. Arsenic ions are implanted into the channel diffusion region 3 using the remained resist 32 as a mask. The cross-section at this stage is shown in FIG. 25.

Figure 26:
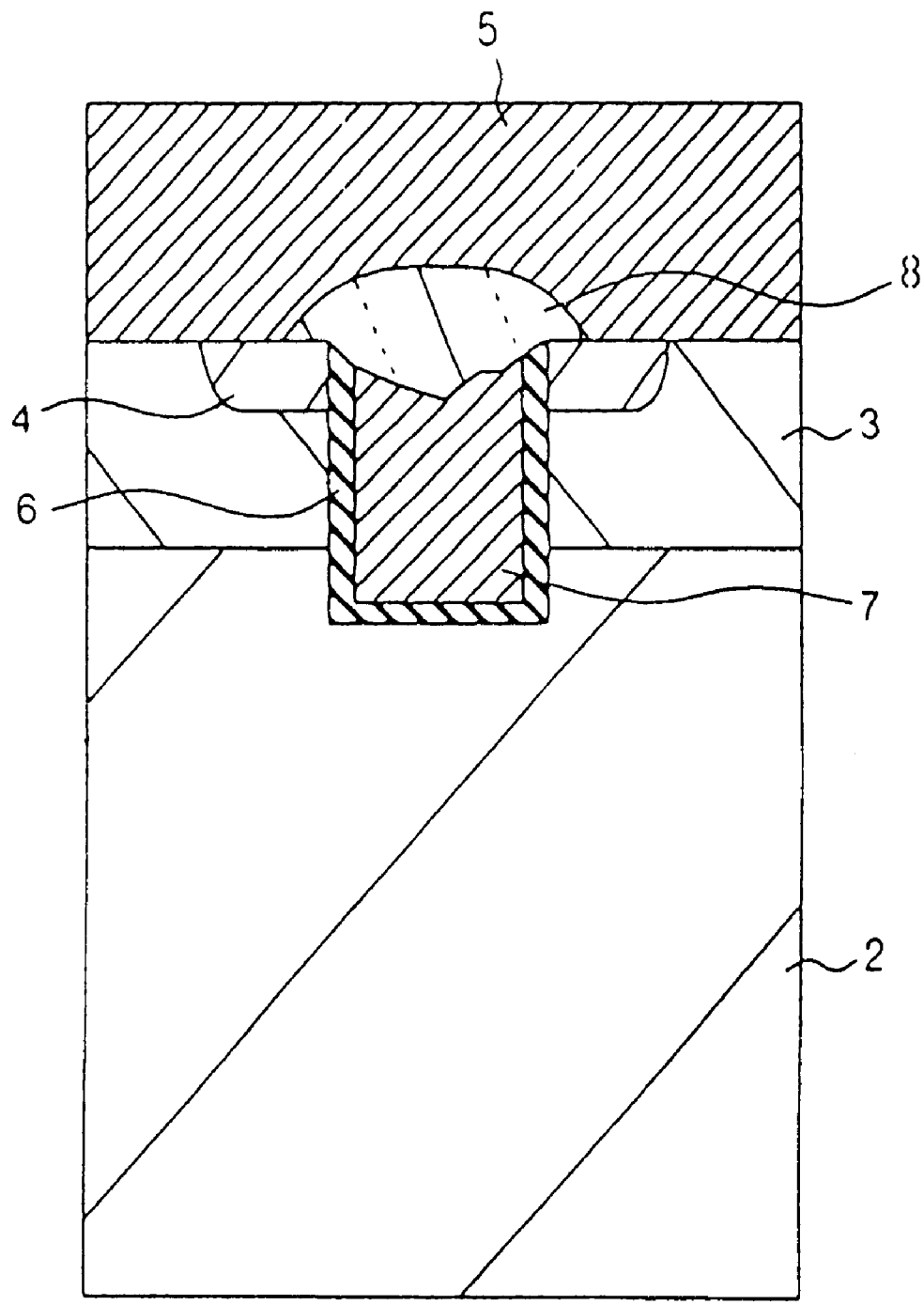
FIG. 26 is a cross-sectional view of an IGBT at a stage of the manufacturing process for an IGBT having the structure shown in FIG. 23.

After removing the photoresist 32, heat treatment is conducted to recover from the damage caused by the ion implantation and to activate the implanted ions, resulting in formation of the channel diffusion region 3 and the emitter diffusion region 4. Then, an insulator film 8 is laminated. By partially etching the insulator film 8, the channel diffusion region 3 and a portion of the emitter diffusion region 4 are exposed while the gate electrode 7 is covered. An emitter electrode 5 is then deposited thereon. The cross-section at this stage is shown in FIG. 26.

Figure 27:
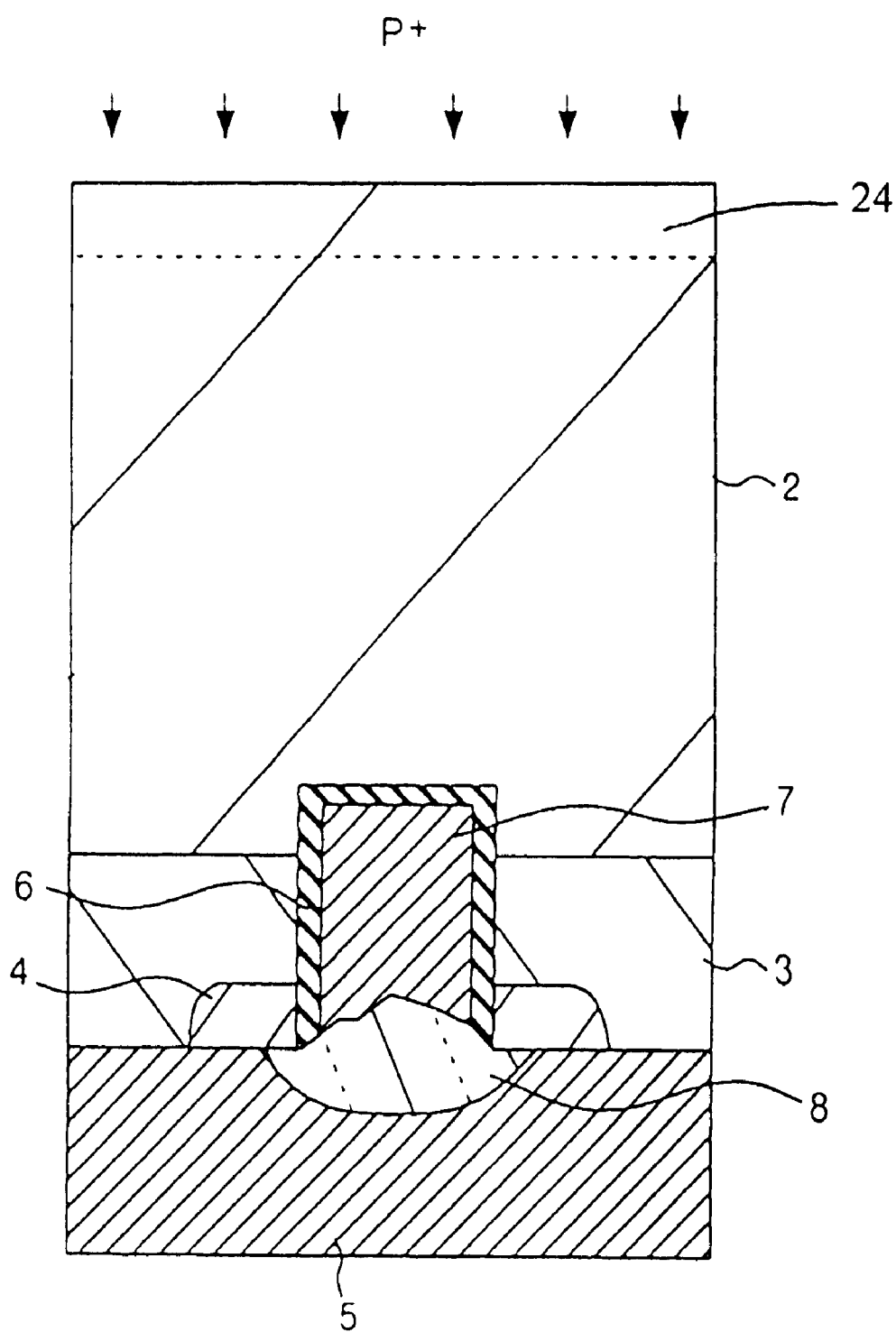
FIG. 27 is a cross-sectional view of an IGBT at a stage of the manufacturing process for an IGBT having the structure shown in FIG. 23.

The manufacturing process after this stage is the same as that in an IGBT having a planar gate structure described earlier. Namely, after polishing the wafer to the thickness of 120 µm, the polished surface of the wafer is selectively cleaned using an ammonia-hydrogen peroxide mixture. Then, phosphorus ions are implanted for forming a field-stop layer 24 as shown in FIG. 27. The polish is executed in such a manner as the centerline average height Ra is not larger than 1 µm and the filtered center line waviness Wca is not more than 10 µm.

Figure 28:
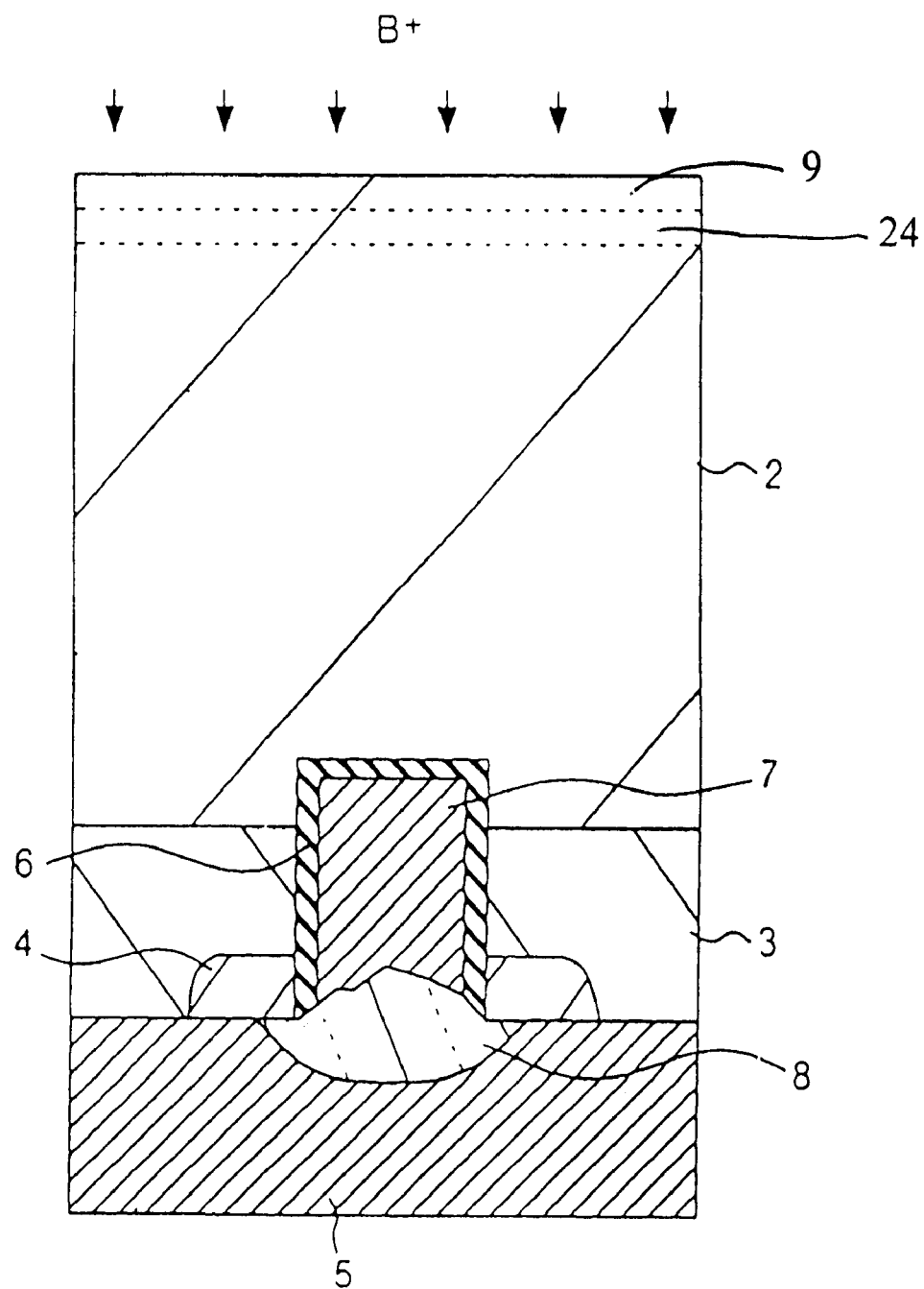
FIG. 28 is a cross-sectional view of an IGBT at a stage of the manufacturing process for an IGBT having the structure shown in FIG. 23.
Figure 29:
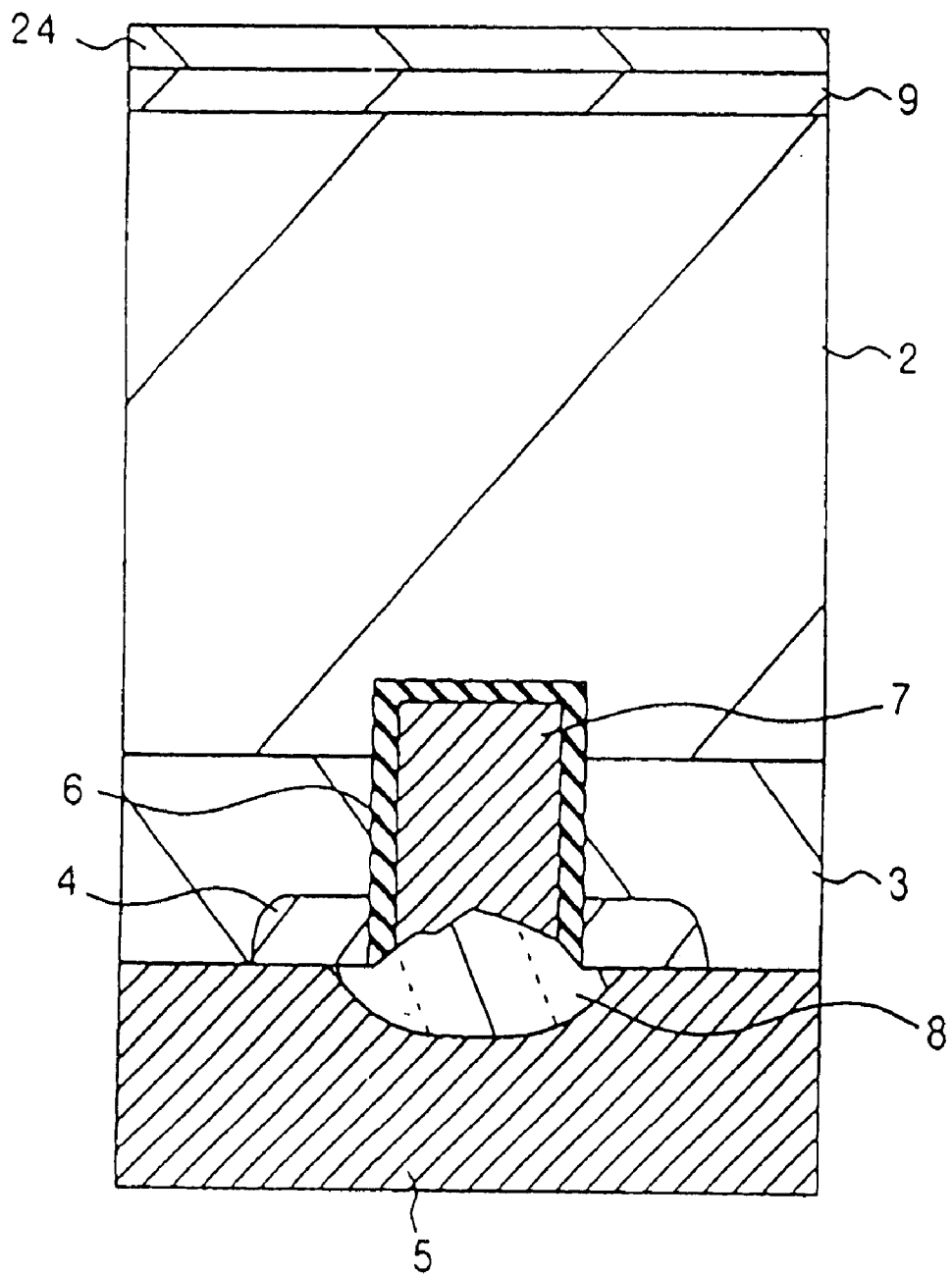
FIG. 29 is a cross-sectional view of an IGBT at a stage of the manufacturing process for an IGBT having the structure shown in FIG. 23.
Figure 30:
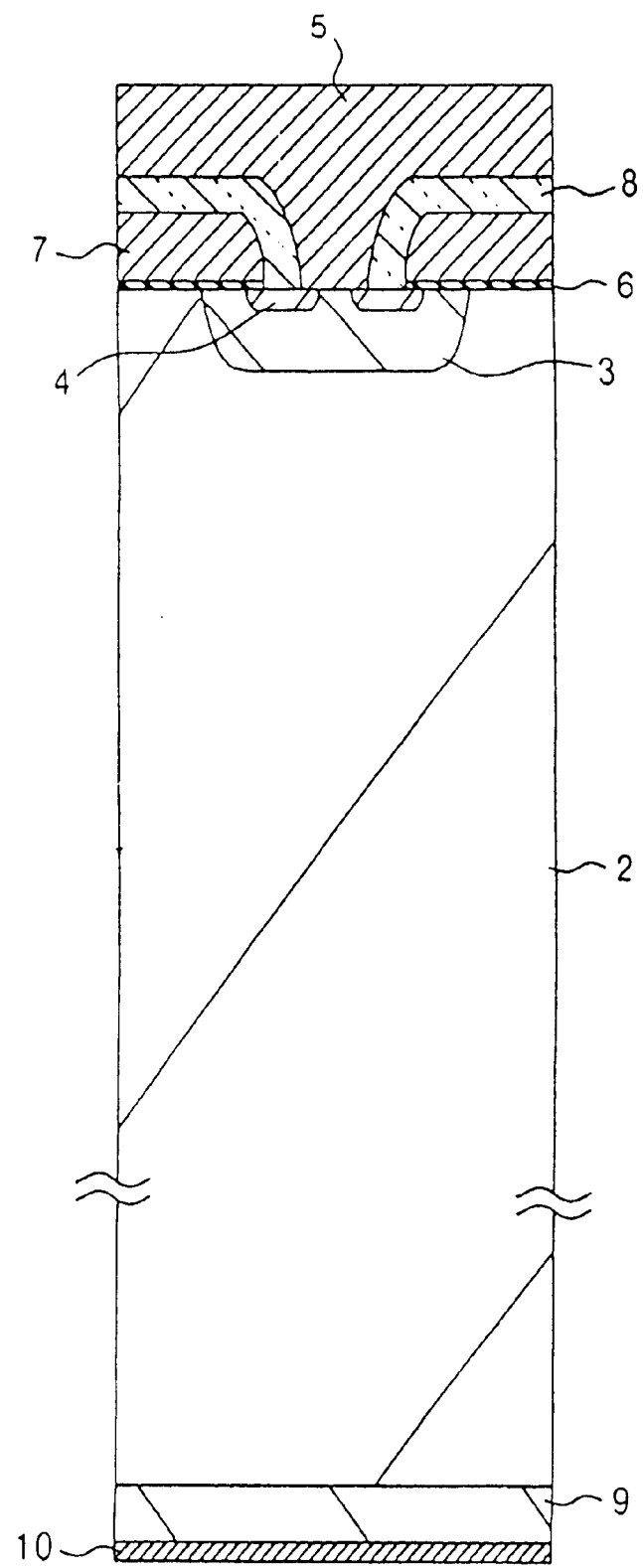
FIG. 30 is a cross-sectional view of an example of conventional IGBT.
Figure 31:
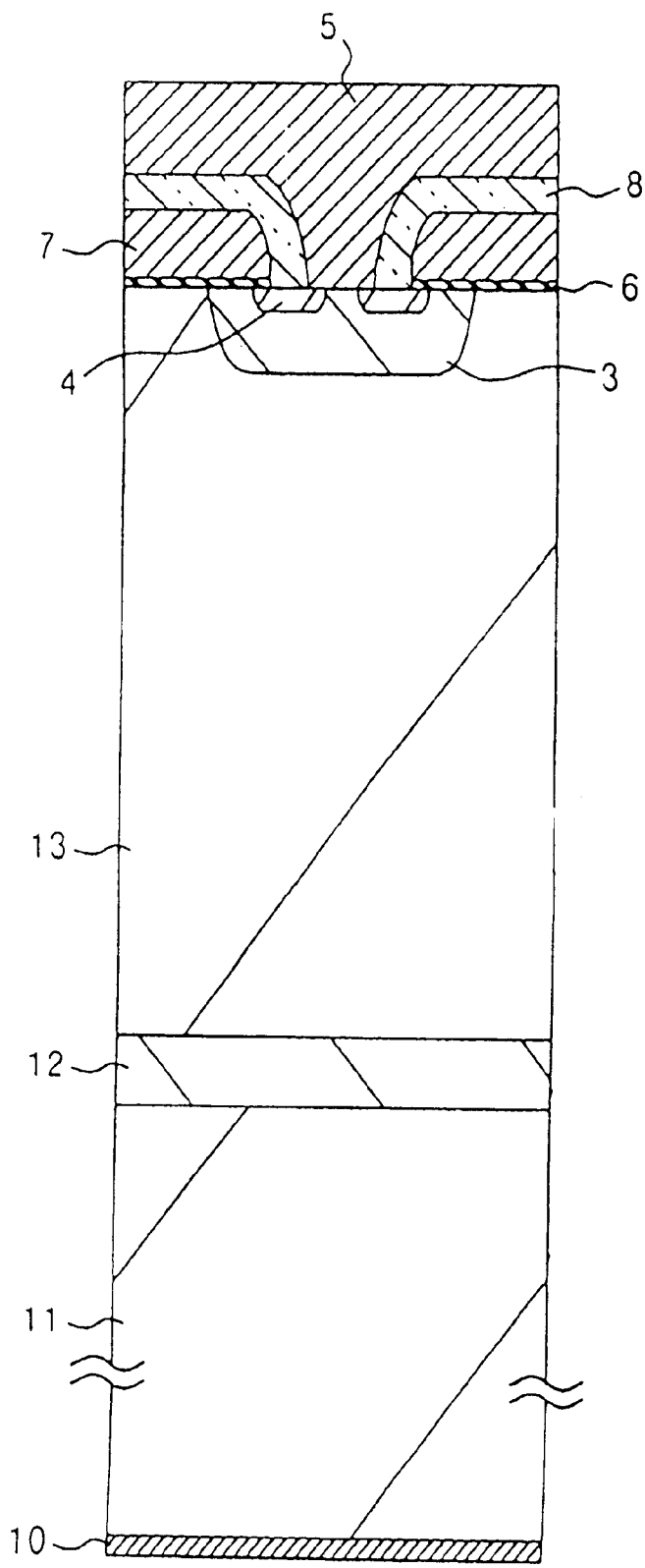
FIG. 31 is a cross-sectional view of another example of conventional IGBT.
Figure 32:
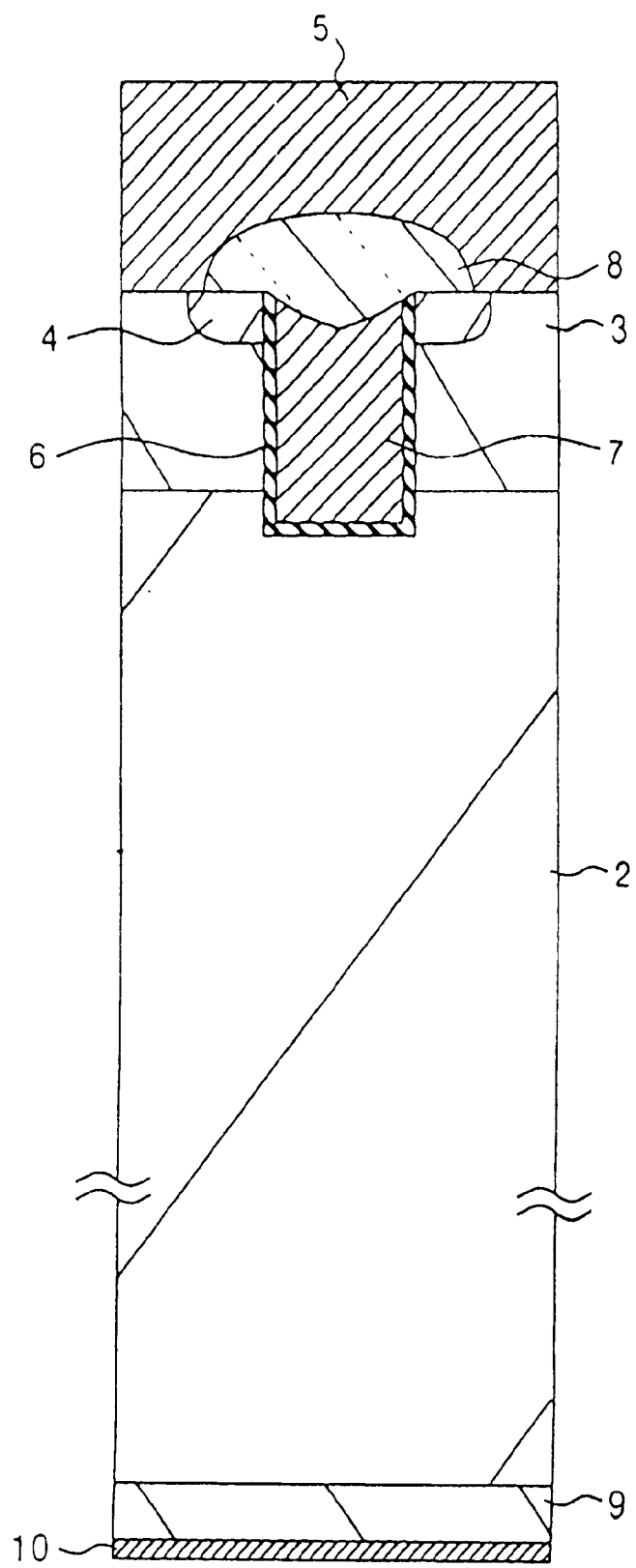
FIG. 32 is a cross-sectional view of another example of conventional IGBT.
Figure 33:
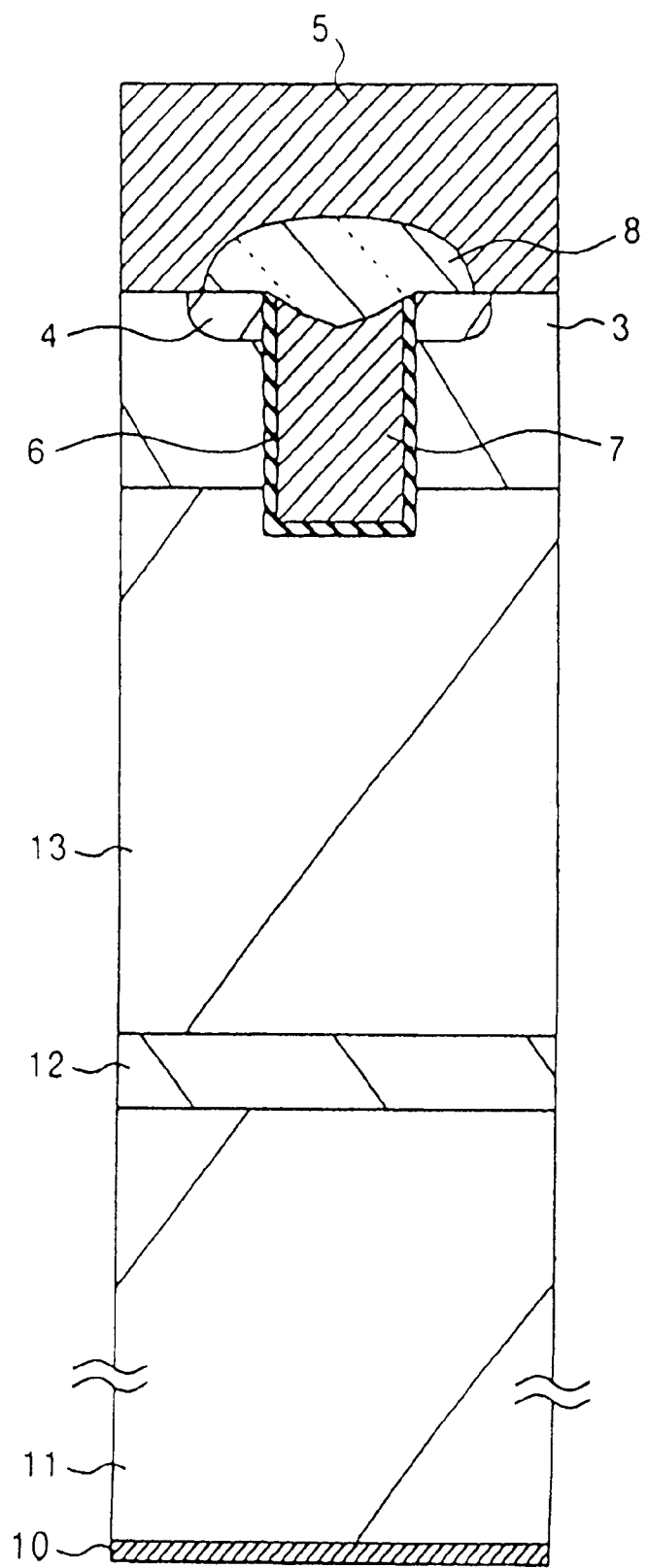
FIG. 33 is a cross-sectional view of another example of conventional IGBT.

Boron ions are subsequently implanted for forming the collector layer 9 and the contact layer, which is not illustrated with a shorter range, as shown in FIG. 28. In the implantation of the boron ions, the wafer is held at a temperature lower than the room temperature. After that, diffusion furnace annealing is conducted at a temperature from 300° C. to 550° C. to form a field-stop layer 24 and a collector layer 9, as shown in FIG. 29. On the surface of the collector layer 9, a collector electrode 10 is deposited by a sputtering method, for example. In the step, aluminum or platinum is first deposited to a thickness from 0.3 µm to 1 µm, for example. Thus, an IGBT having a structure as shown in FIG. 23 is completed.

In the procedure for manufacturing an IGBT having a structure as shown in FIG. 23, the steps for forming the structure on the collector layer side are same as the steps for forming the structure on the collector layer side of an IGBT having a structure as shown in FIG. 1. Accordingly, the explanations given with reference to FIGS. 9 through 22 apply equally to the manufacturing process of an IGBT having the structure in FIG. 23.

In the above-described aspects of embodiments of the invention, the field-stop layer 24 and the collector layer 9 are formed by means of ion implantation. Therefore, the IGBT of the invention can be produced employing an inexpensive wafer such as an FZ wafer as in a non-punch-through type IGBT with high yields. In addition, provision of the field-stop layer 24 allows the base layer 2 to be as thin as in a punch-through type IGBT, thus reducing losses. In short, the IGBT of the invention is low-cost as a non-punch-through type IGBT and low-loss as a punch-through type IGBT.

Modifications are possible in embodiments of the invention. For example, the annealing step may be conducted after each of the steps of ion implantation for forming the field-stop layer 24, the collector layer 9, and the contact layer. The annealing process after ion implantation for forming the field-stop layer 24, collector layer 9, and the contact layer may be performed by means of an electron beam annealing method or a microwave annealing method. In addition, the electron bean annealing and the microwave annealing may be applied in combination with the diffusion furnace annealing, the rapid thermal annealing, or the laser annealing. Further, the manufacturing method of the invention can be applied to all the IGBTs of blocking voltage class of 600 V, 900 V, 1,200 V, 1,400 V, 1,800 V, 2,000 V, 2,500 V, and other voltage classes.

In an IGBT according to the invention, the field-stop layer, which is an impurity diffusion layer and a collector layer are formed by means of ion implantation. Therefore, the IGBT of the invention can be produced employing an inexpensive wafer such as an FZ wafer like in a non-punch-through type IGBT with high yields. Moreover, provision of the field-stop layer allows the base layer to be as thin as in a punch-through type IGBT, to obtain an IGBT with reduced losses. An IGBT according to the invention is low-cost as a non-punch-through type IGBT and low-loss as a punch-through type IGBT.

What is claimed is:

1. A method for manufacturing a semiconductor device comprising the steps of:

forming a p-type channel diffusion region, an n-type emitter diffusion region, an emitter electrode, a gate-insulating film, and a gate electrode in one principal surface region of an n-type semiconductor substrate that has resistivity uniform in a thickness direction and composes a base layer;

implanting phosphorus ions into a shallow portion of a reverse principal surface region of said substrate and implanting boron ions into a portion of said reverse principal surface region shallower than said shallow portion followed by annealing of said substrate, so as to form an n-type impurity diffusion layer having an impurity concentration higher than an impurity concentration in said base layer and to form a p-type collector layer shallower than said impurity diffusion layer, wherein Xfs–XJ is in a range from 0.5 $\mu$m to 3 $\mu$m, Xfs being a position at which an impurity concentration in said impurity diffusion layer becomes twice an impurity concentration of said base layer and XJ being a position of a junction between said impurity diffusion layer and said collector layer; and forming a collector electrode on said collector layer.

2. A method for manufacturing a semiconductor device according to claim 1, further comprising a step for forming a contact layer that contacts with said collector electrode with low resistance, by implanting boron ions or $BF_2^+$ ions into a portion shallower than said collector layer before forming said collector electrode.

3. A method for manufacturing a semiconductor device according to claim 1, wherein said step of implanting boron ions is conducted holding said substrate at a temperature lower than room temperature.

4. A method for manufacturing a semiconductor device according to claim 1, wherein said step of annealing is diffusion furnace annealing conducted at a temperature from 300° C. to 550° C.

5. A method for manufacturing a semiconductor device according to claim 1, wherein said step of annealing is rapid thermal annealing conducted at a temperature from 300° C. to 600° C.

6. A method for manufacturing a semiconductor device according to claim 1, wherein said step of annealing is laser annealing that irradiates laser light having a wavelength of 150 nm to 1,060 nm with irradiation energy density in the range from 0.5 $J/cm^2$ to 3 $J/cm^2$.

7. A method for manufacturing a semiconductor device according to claim 1, wherein said step of annealing is a combination of two or three annealing processes selected from diffusion furnace annealing conducted at a temperature from 300° C. to 550° C., rapid thermal annealing conducted at a temperature from 300° C. to 600° C., and laser annealing that irradiates laser light having a wavelength of 150 nm to 1,060 nm with irradiation energy density in the range from 0.5 $J/cm^2$ to 3 $J/cm^2$.

8. A method for manufacturing a semiconductor device according to claim 1, further comprising a step of polishing said reverse principal surface of said substrate making a center line average height Ra not larger than 1 $\mu$m before said step of implanting phosphorus ions.

9. A method for manufacturing a semiconductor device according to claim 1, further comprising a step of polishing said reverse principal surface of said substrate making filtered center line waviness Wca not larger than 10 $\mu$m before said step of implanting phosphorus ions.

10. A method for manufacturing a semiconductor device according to claim 1, further comprising a step of selectively cleaning said reverse principal surface of said substrate using an aqueous chemical solution before said step of implanting phosphorus ions.

11. A method for manufacturing a semiconductor device according to claim 10, wherein said aqueous chemical solution is an ammonia-hydrogen peroxide mixture.

12. A method for manufacturing a semiconductor device according to claim 1, further comprising a step of selectively cleaning said reverse principal surface of said substrate using functional water consisting of hydrogenated ultrapure water and ozonized ultrapure water and simultaneously employing megasonic frequencies before said step of implanting phosphorus ions.

13. A method for manufacturing a semiconductor device according to claim 1, further comprising two combined steps of selectively cleaning said reverse principal surface of said substrate using an aqueous chemical solution and selectively cleaning said reverse principal surface of said substrate using functional water consisting of hydrogenated ultrapure water and ozonized ultrapure water and simultaneously employing megasonic frequencies before said step of implanting phosphorus ions.

14. A method for manufacturing a semiconductor device according to claim 13, wherein said aqueous chemical solution is an ammonia-hydrogen peroxide mixture.

15. A method for manufacturing a semiconductor device according to claim 1, wherein a portion of said collector electrode that contacts with semiconductor material is composed of an aluminum layer.

16. A method for manufacturing a semiconductor device according to claim 15, wherein said aluminum layer has a thickness of not smaller than 0.3 $\mu$m.

17. A method for manufacturing a semiconductor device according to claim 1, wherein a portion of said collector electrode that contacts with semiconductor material is composed of a platinum layer.

18. A method for manufacturing a semiconductor device according to claim 17, wherein said platinum layer has a thickness of not smaller than 0.3 $\mu$m.

* * * * *